US009406392B2

(12) United States Patent
Kyung et al.

(10) Patent No.: US 9,406,392 B2
(45) Date of Patent: Aug. 2, 2016

(54) MEMORY SYSTEM AND A PROGRAMMING METHOD THEREOF

(75) Inventors: Yoon-Young Kyung, Suwon-si (KR); Nam-Ho Kim, Seoul (KR); Hyun Jin Choi, Suwon-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 608 days.

(21) Appl. No.: 13/535,934

(22) Filed: Jun. 28, 2012

(65) Prior Publication Data

US 2013/0159607 A1 Jun. 20, 2013

(30) Foreign Application Priority Data

Dec. 19, 2011 (KR) ........................ 10-2011-0137395

(51) Int. Cl.
| | |
|---|---|
| *G06F 12/00* | (2006.01) |
| *G11C 16/34* | (2006.01) |
| *G06F 12/02* | (2006.01) |
| *G11C 16/10* | (2006.01) |
| *G11C 16/04* | (2006.01) |
| *G11C 5/14* | (2006.01) |
| *G11C 7/04* | (2006.01) |
| *G11C 11/56* | (2006.01) |
| *G11C 29/02* | (2006.01) |

(52) U.S. Cl.
CPC ........ *G11C 16/3404* (2013.01); *G06F 12/0246* (2013.01); *G11C 5/147* (2013.01); *G11C 7/04* (2013.01); *G11C 11/5628* (2013.01); *G11C 16/0483* (2013.01); *G11C 16/10* (2013.01); *G11C 29/028* (2013.01)

(58) Field of Classification Search
USPC ................ 711/103, 115; 365/185.33, 185.29, 365/185.11
See application file for complete search history.

(56) References Cited

U.S. PATENT DOCUMENTS

| | | | |
|---|---|---|---|
| 5,521,527 A * | 5/1996 | Sakata et al. ..................... 326/21 |
| 6,785,327 B1 | 8/2004 | Larsson et al. | |
| 7,092,308 B2 | 8/2006 | Choi et al. | |
| 7,509,588 B2 | 3/2009 | Van Os et al. | |
| 7,715,231 B2 | 5/2010 | Kim et al. | |
| 7,821,812 B2 | 10/2010 | Kim | |
| 7,925,936 B1 * | 4/2011 | Sommer ....................... 714/704 |
| 8,027,194 B2 * | 9/2011 | Lee et al. ................. 365/185.03 |
| 8,111,563 B2 | 2/2012 | Kim et al. | |
| 2002/0066047 A1 * | 5/2002 | Olarig et al. .................. 713/323 |
| 2003/0189856 A1 * | 10/2003 | Cho et al. ....................... 365/200 |
| 2007/0133249 A1 * | 6/2007 | Roohparvar .................. 365/100 |
| 2008/0061889 A1 * | 3/2008 | Matsumoto et al. ............ 331/11 |
| 2008/0145274 A1 | 6/2008 | Habibi-Naini | |

(Continued)

FOREIGN PATENT DOCUMENTS

| | | |
|---|---|---|
| KR | 100816155 | 3/2008 |
| KR | 20080055639 | 6/2008 |
| KR | 1020100107609 | 10/2010 |

*Primary Examiner* — Yaima Rigol
*Assistant Examiner* — Tasnima Matin
(74) *Attorney, Agent, or Firm* — F. Chau & Associates, LLC

(57) ABSTRACT

A method of programming a storage device includes determining, at a controller of the storage device, that a first program mode of a plurality of program modes is to be entered in response to first information, wherein the first information includes a parameter associated with temperature, power consumption or input/output workload, and changing, using the controller, a program ratio of a first programming and a second programming of the storage device in the first program mode.

11 Claims, 25 Drawing Sheets

(56) References Cited

U.S. PATENT DOCUMENTS

| | | |
|---|---|---|
| 2008/0158953 A1* | 7/2008 | Wang et al. .............. 365/185.03 |
| 2008/0172520 A1* | 7/2008 | Lee ............................... 711/103 |
| 2008/0177934 A1* | 7/2008 | Yu et al. ........................ 711/103 |
| 2009/0310408 A1* | 12/2009 | Lee et al. ................. 365/185.03 |
| 2009/0310415 A1 | 12/2009 | Jin et al. |
| 2010/0062715 A1 | 3/2010 | Kim et al. |
| 2010/0078701 A1 | 4/2010 | Shim et al. |
| 2010/0082890 A1 | 4/2010 | Heo et al. |
| 2010/0117141 A1 | 5/2010 | Shin et al. |
| 2010/0140685 A1 | 6/2010 | Kang et al. |
| 2010/0213527 A1 | 8/2010 | Shim et al. |
| 2010/0224929 A1 | 9/2010 | Jeong et al. |
| 2010/0274951 A1 | 10/2010 | Fang et al. |
| 2010/0309237 A1 | 12/2010 | Roh |
| 2010/0315325 A1 | 12/2010 | Hwang |
| 2010/0315875 A1 | 12/2010 | Kim et al. |
| 2010/0322000 A1 | 12/2010 | Shim et al. |
| 2011/0013458 A1 | 1/2011 | Seol |
| 2011/0018036 A1 | 1/2011 | Hwang et al. |
| 2012/0317346 A1* | 12/2012 | Yeh ................................ 711/103 |
| 2014/0108705 A1* | 4/2014 | Gorobets ...................... 711/103 |

* cited by examiner

MEMORY SYSTEM AND A PROGRAMMING METHOD THEREOF

CROSS-REFERENCE TO RELATED APPLICATION

This application claims priority under 35 U.S.C §119 to Korean Patent Application No. 10-2011-0137395 filed Dec. 19, 2011, the disclosure of which is incorporated by reference herein in its entirety.

BACKGROUND

1. Technical Field

The inventive concept relates to a memory system and a programming method thereof.

2. Discussion of the Related Art

Semiconductor memory devices may be volatile memory devices or nonvolatile memory devices. Nonvolatile memory devices can retain data even when not powered. Data stored in nonvolatile memory devices may be permanent or reprogrammable, depending upon the fabrication technology used. Nonvolatile memory devices are generally used for user data, program and microcode storage in a wide variety of applications in the computer, avionics, telecommunications, and consumer electronics industries.

SUMMARY

An exemplary embodiment of the inventive concept provides a method of programming a storage device, the method including: determining, at a controller of the storage device, that a first program mode of a plurality of program modes is to be entered in response to first information, wherein the first information includes a parameter associated with temperature, power consumption or input/output workload; and changing, using the controller, a program ratio of a first programming and a second programming of the storage device in the first program mode.

The program ratio of the first and second programmings is non-uniform in the first mode.

The program ratio of the first and second programmings is uniform in a second mode of the plurality of program modes.

The first programming is performed more times than the second programming.

The first programming consumes less power or generates less heat than the second programming.

The storage device includes a 2-bit cell.

The first programming is a least significant bit (LSB) program operation on the 2-bit cell and the second programming is a most significant bit (MSB) program operation on the 2-bit cell.

An exemplary embodiment of the inventive concept provides a method of programming a storage device, the method including: determining, at a controller of the storage device, that a first program mode of a plurality of program modes is to be entered in response to first information, wherein the first information includes a parameter associated with temperature, power consumption or input/output workload; and changing, using the controller, a program ratio of a first programming, a second programming and a third programming of the storage device in the first program mode.

The program ratio is changed such that the first programming is performed more times than each of the second and third programmings, and wherein the second and third programmings are performed the same number of times.

The program ratio is changed such that the first and second programmings are each performed more times than the third programming, and wherein the first and second programmings are performed the same number of times.

The program ratio is changed such that the first to third programmings are performed a different number of times from each other.

The storage device includes a 3-bit cell.

The first programming is an LSB program operation on the 3-bit cell, the second programming is a center significant bit (CSB) program operation on the 3-bit cell and the third programming is an MSB program operation on the 3-bit cell.

An exemplary embodiment of the inventive concept provides a method of programming a storage device, the method including: determining, at a controller of the storage device, that a low power mode is to be entered in response to first information, wherein the first information includes a low power mode command or a temperature management command; and changing, using the controller, a program ratio of a first programming and a second programming of the storage device in the low power mode.

An exemplary embodiment of the inventive concept provides a method of programming a storage device, the method including: determining, at a controller of the storage device, that an operating mode of the storage device is a low power mode; determining, at the controller when in the low power mode, that a first program mode of a plurality of program modes is not executable, due to deterioration in performance of the storage device; invoking a power reduction scheme in response to the determination that the first program mode is not executable; and performing first and second programmings in the storage device in a second program mode of the plurality of program modes, in accordance with the power reduction scheme.

A program ratio of the first and second programmings is uniform in the second program mode and the program ratio of the first and second programmings is not uniform in the first program mode.

An exemplary embodiment of the inventive concept provides a portable device, the device including: a nonvolatile memory device configured to operate in first and second program modes; and a controller configured to determine that the first program mode is to be entered in response to first information, and change a program ratio of a first programming and a second programming of the nonvolatile memory device in the first program mode, wherein the first information includes a parameter associated with temperature, power consumption or input/output workload.

An exemplary embodiment of the inventive concept provides a memory system, the system including: a plurality of nonvolatile memory devices, wherein each of the nonvolatile memory devices is configured to operate in a first program mode and a second program mode; and a controller connected to the nonvolatile memory devices via a plurality of channels, wherein the controller is configured to measure a temperature of the memory system and determine, in response to the measured temperature, whether to operate the nonvolatile memory devices in the first program mode or the second program mode.

In the first program mode a program ratio of first and second programmings is greater than 1:1 and in the second program mode a program ratio of the first and second programmings is 1:1.

Each channel includes a plurality of ways, each way including one of the nonvolatile memory devices connected to the channel.

The memory system is included in a solid state drive.

An exemplary embodiment of the inventive concept provides a memory system, the system including: a plurality of nonvolatile memory devices, wherein each of the nonvolatile memory devices is configured to operate in first and second program modes and measure its temperature; and a controller connected to the nonvolatile memory devices via a plurality of channels, wherein the controller is configured to determine whether to operate the nonvolatile memory devices in the first program mode or the second program mode in response to the measured temperatures, wherein each channel includes a plurality of ways, each way including one of the nonvolatile memory devices connected to the channel.

The first program mode consumes less power or generates less heat than the second program mode.

The controller is configured to disable at least one way in the first program mode.

The memory system is included in a solid state drive.

An exemplary embodiment of the inventive concept provides a memory system, the system including: a nonvolatile memory device including a memory cell array and a control logic; and a controller configured to generate a program mode command in response to environment information, wherein the control logic is configured to perform a first mode programming or a second mode programming in response to the program mode command.

The first mode programming consumes less power or generates less heat than the second mode programming.

An exemplary embodiment of the inventive concept provides a method of programming a storage device, the method including: determining, at a controller of the storage device, whether a measured temperature exceeds a first reference value; determining, at the controller in response to the measured temperature exceeding the first reference value, whether the measured temperature is between the first reference value and a second reference value; and placing, using the controller, the storage device in a first program mode in response to the measured temperature not falling between the first and second reference values, or placing, using the controller, the storage device in a second program mode in response to the measured temperature falling between the first and second reference values, wherein a program ratio of first and second programmings in each of the first and second program modes is not uniform and the program ratio of the first and second programmings in the first program mode is greater than the program ratio of the first and second programmings in the second program mode and a number of ways are reduced in the first program mode, wherein a way includes a memory of the storage device, the memory being connected to the controller via a channel.

BRIEF DESCRIPTION OF THE DRAWINGS

The above and other features of the inventive concept will become more apparent by describing in detail exemplary embodiments thereof with reference to the accompanying drawings, in which.

DETAILED DESCRIPTION OF THE EMBODIMENTS

Figure 1:
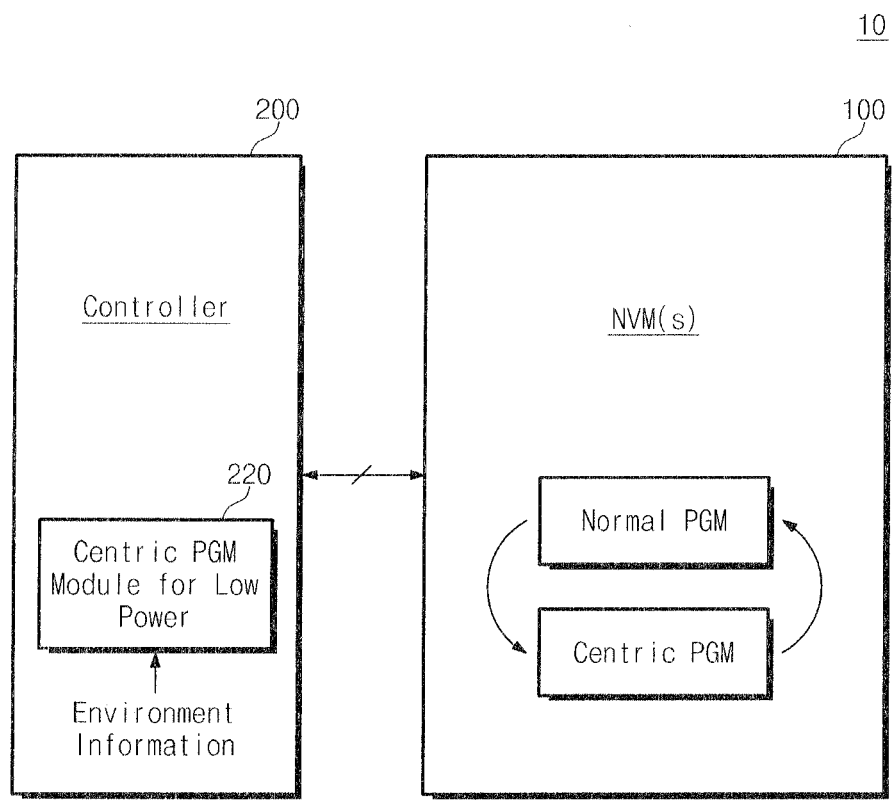
FIG. 1 is a block diagram illustrating a memory system according to an exemplary embodiment of the inventive concept.

Hereinafter, exemplary embodiments of the inventive concept will be described in detail with reference to the accompanying drawings. The inventive concept may, however, be embodied in many different forms and should not be construed as limited to the exemplary embodiments set forth herein. Throughout the drawings and specification, like reference numerals may refer to like elements.

FIG. 1 is a block diagram illustrating a memory system according to an exemplary embodiment of the inventive concept. Referring to FIG. 1, a memory system 10 may include at least one nonvolatile memory device 100 and a controller (or, memory controller) 200 for controlling the nonvolatile memory device 100.

The nonvolatile memory device 100 may be a NAND flash memory, a vertical NAND flash memory (VNAND), a NOR flash memory, a Resistive Random Access Memory (RRAM), a Phase-change RAM (PRAM), a Magnetroresistive RAM (MRAM), a Ferroelectric RAM (FRAM), a Spin Transfer Torque RAM (STT-RAM), or the like. The nonvolatile memory device 100 according to an exemplary embodiment of the inventive concept may have a three-dimensional array structure. The inventive concept may be applicable to both a Charge Trap Flash (CTF) memory, in which a charge storage layer is formed of an insulation film, and a flash memory device in which a charge storage layer is formed of a conductive floating gate. Below, for ease of description, the nonvolatile memory device 100 may be assumed to be a NAND flash memory device.

The nonvolatile memory device 100 may perform a program operation according to either one of a normal program mode and a centric program mode. The normal program mode may mean that at least two types of program operations are performed with a uniform ratio. The centric program mode may mean that at least two types of program operations are performed with a non-uniform ratio. Herein, the at least two types of program operations may include a first programming and at least one second programming. Power consumption or heat generated at the first programming may be less than that generated at the second programming.

In an exemplary embodiment of the inventive concept, in the centric program mode, the second programming, which on a one-to-one comparison with the first programming causes more power consumption or heat, may be centrically performed, such that the power or heat generated due to the second programming drops.

In an exemplary embodiment of the inventive concept, at least two types of program operations may be program steps each forming a multi-bit program operation. For example, a first programming may be a Least Significant Bit (LSB) page program operation, and a second programming may be a Most Significant Bit (MSB) page program operation.

In general, the LSB page program operation and the MSB page program operation may be different from each other as it pertains to program attribute. The LSB page program operation may be performed to shift a threshold voltage of a memory cell to one of an erase state and a program state. The MSB page program operation may be performed to shift a threshold voltage of a memory cell to one of an erase state and first to third program states. Thus, power consumption or heat generated by the LSB page program operation may be less than power consumption or heat generated by the MSB page program operation.

The controller 200 may control the nonvolatile memory device 100. The controller 200 may control the nonvolatile memory device 100 to perform a centric program mode. The controller 200 may include a centric program module 220 that controls the nonvolatile memory device 100 to perform the centric program mode based on environment information associated with power.

In an exemplary embodiment of the inventive concept, the environment information may include a heat level (or, temperature) of the memory system 10, a heat level (or, temperature) of the nonvolatile memory device 100, a heat level (or, temperature) of the controller 200, power consumption of the memory system 10, input/output work load, and the like. The environment information may be at least one parameter associated with power or heat of the memory system 10. For example, when input/output work load is large, power consumption or heat may be large.

In an exemplary embodiment of the inventive concept, the environment information may be a command chosen by a user of the memory system 10. For example, the environment information may be a low-power mode enter command or a temperature management enter command.

The centric program module 220 may control the nonvolatile memory device 100 such that one program operation (e.g., LSB programming) is performed more than another program operation (e.g., MSB programming), based on the environment information. In other words, the centric program module 220 may adjust/vary/change/control a ratio of at least two program operations dynamically based on the environment information.

A conventional memory system may perform a program operation regardless of environmental factors, thus generating large power consumption and heat. On the other hand, the memory system 10 according to an exemplary embodiment of the inventive concept may reduce power consumption or heat without lowering its performance, by centrically performing a predetermined program operation to lower power consumption based on environment information.

Figure 2:
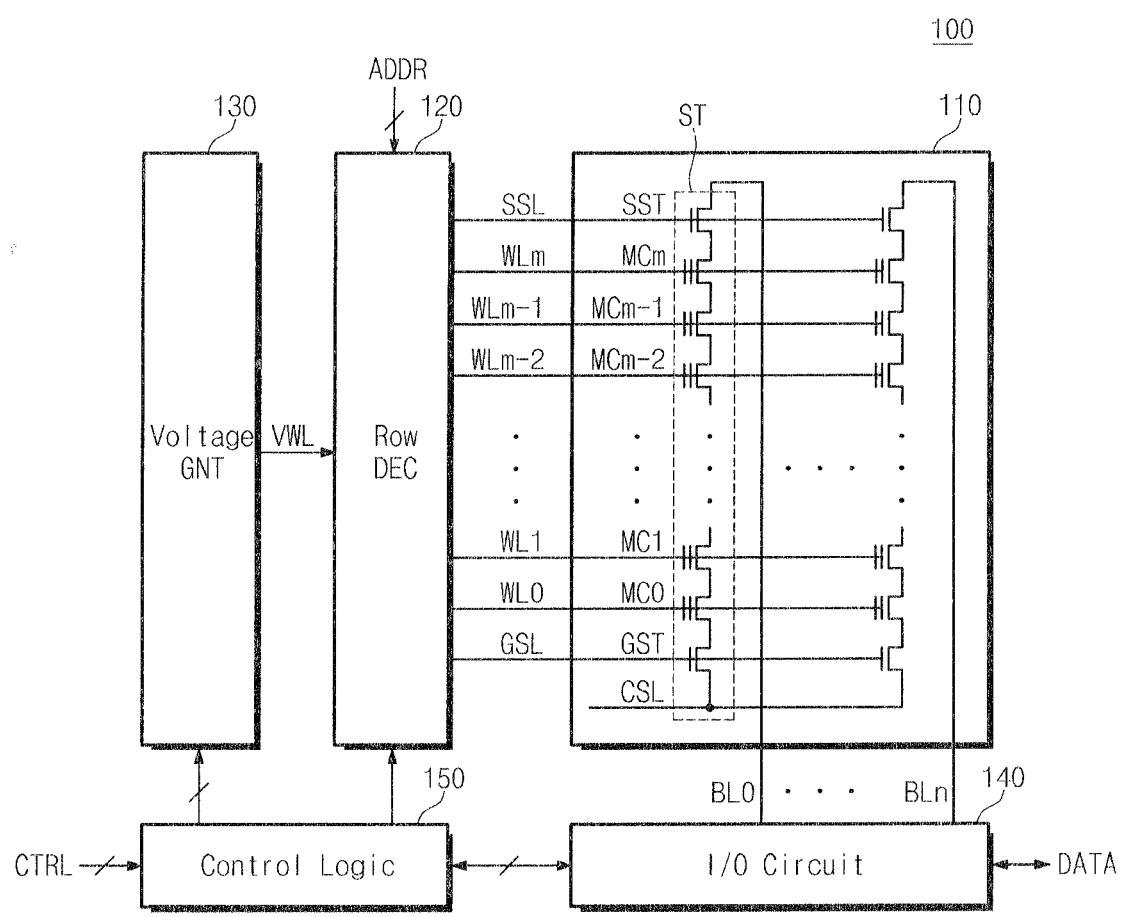
FIG. 2 is a block diagram illustrating a nonvolatile memory device illustrated in FIG. 1, according to an exemplary embodiment of the inventive concept.

FIG. 2 is a block diagram illustrating a nonvolatile memory device illustrated in FIG. 1, according to an exemplary embodiment of the inventive concept. Referring to FIG. 2, a nonvolatile memory device 100 may include a memory cell array 110, a row decoder 120, a voltage generator circuit 130, an input/output circuit 140, and control logic 150.

The memory cell array 110 may include a plurality of memory blocks. For ease of illustration, one memory block is illustrated in FIG. 2. A memory block may include strings ST that are connected to bit lines BL0 to BLn (n being a natural number). A string ST connected to a hit line BL0 may include a string selection transistor SST, memory cells MC0 to MCm (m being a natural number), and a ground selection transistor GST that are connected in series. The string selection transistor SST may be driven by voltages supplied via a string selection line SSL. The ground selection transistor GST may be driven by voltages supplied via a ground selection line GSL. The ground selection transistor GST is also connected to a common source line CSL. The memory cells MC0 to MCm may store at least one bit of data, respectively, and may be driven by voltages transferred via corresponding word lines WL0 to WLm. Strings ST connected to the remaining bit lines BL1 to BLn may be configured the same way as the string ST connected to the bit line BL0.

A program operation may be carried out by a unit of memory cells connected to each of the word lines WL0 to WLm. In a program operation, memory cells connected to each of the word lines WL0 to WLm may be programmed by at least two program steps. For example, for a 2-bit program operation, LSB page programming may be performed, and then MSB page programming may be performed. For a 3-bit program operation, LSB page programming may be performed first, Center Significant Bit (CSB) page programming may be performed second, and MSB page programming may be performed last.

The row decoder 120 may select one of the plurality of memory blocks in response to an address, and may provide the word lines WL0 to WLm with word line voltages VWL for driving (e.g., a program voltage, a pass voltage, an erase voltage, a verification voltage, a read voltage, a read pass voltage, etc.).

The voltage generator circuit 130 may generate the word line voltages VWL for driving. Although not illustrated in FIG. 2, the voltage generator circuit 130 may include a high voltage generator for generating a high voltage, a low voltage generator for generating a low voltage, a negative voltage generator for generating a negative voltage, and the like.

In a program operation, the input/output circuit 140 may temporarily store data DATA input from an external device to load it onto a page to be written. In a read operation, the input/output circuit 140 may read data from a corresponding page to temporarily store the read data. The input/output circuit 140 may output the temporarily stored data DATA to the external device. Although not illustrated in FIG. 2, the input/output circuit 140 may include page buffers respectively corresponding to the bit lines BL0 to BLn. Herein, each page buffer may include at least one latch that is configured to temporarily store data to be programmed in a memory cell connected to a corresponding bit line or data read from the memory cell connected to the corresponding bit line.

The control logic 150 may control an operation of the nonvolatile memory device 100. The control logic 150 may parse control signals and commands CTRL provided from the external device to control the row decoder 120, the voltage generator circuit 130, and the input/output circuit 140 according to the parsing result. In other words, the control logic 150 may control the voltage generator circuit 130 to generate voltages for driving (e.g., programming, reading, erasing, etc.), the row decoder 120 to transfer the voltages to the word lines WL0 to WLm, and the input/output circuit 140 to input page data to be programmed or to output read page data.

Figure 3:
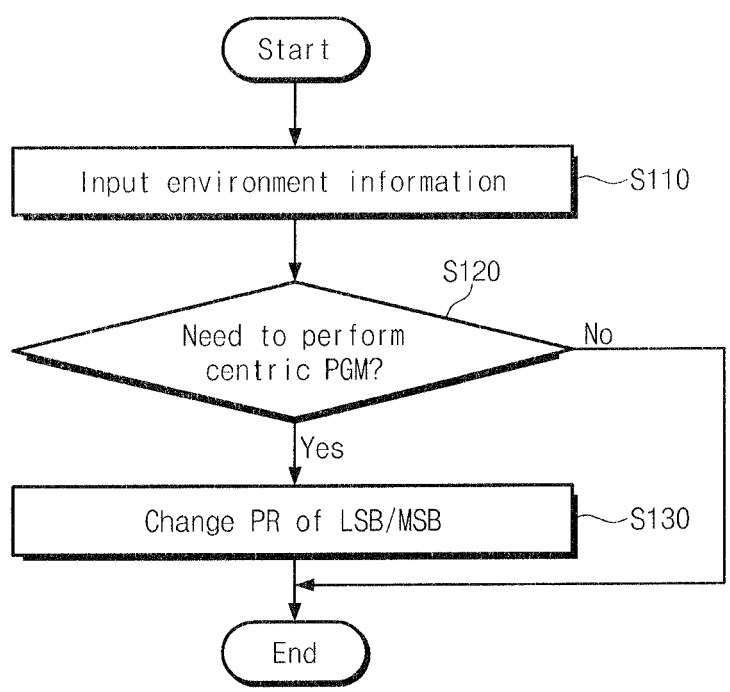
FIG. 3 is a flowchart describing a program method of a memory system according to an exemplary embodiment of the inventive concept.

FIG. 3 is a flowchart describing a program method of a memory system according to an exemplary embodiment of the inventive concept. A program method will be described with reference to FIGS. 1 to 3.

In operation S110, the centric program module 220 of the controller 200 may receive environment information. Herein, the environment information may be a parameter associated with power. For example, the environment information may include temperature information, power information, and/or input/output work load.

In operation S120, the centric program module 220 may judge whether a centric program mode is needed, based on the input environment information. For example, if environment information is input when a temperature of the memory system 10 is over a reference temperature, if a command directing a low-power mode of operation is input by a user, or if a size of write-requested data is over a reference size, the centric program mode may be determined by the centric program module 220 as needed.

If the centric program mode is required, in operation S130, the centric program module 220 may change a program ratio PR of an LSB page to an MSB page to a reference value. For example, the program ratio PR may be set to 1 for a normal program mode and to 3 for a centric program mode. Herein, '3' may mean that MSB page programming is performed once when LSB page programming is performed three times. If the centric program mode is not required, a normal program mode may be performed. In other words, in the normal program mode, a program ratio PR of the LSB page to the MSB page may be '1'.

With the program method according to an exemplary embodiment of the inventive concept, a program ratio PR of LSB page programming to MSB page programming may be adjusted/varied/changed/controlled according to environment information.

Figure 4:
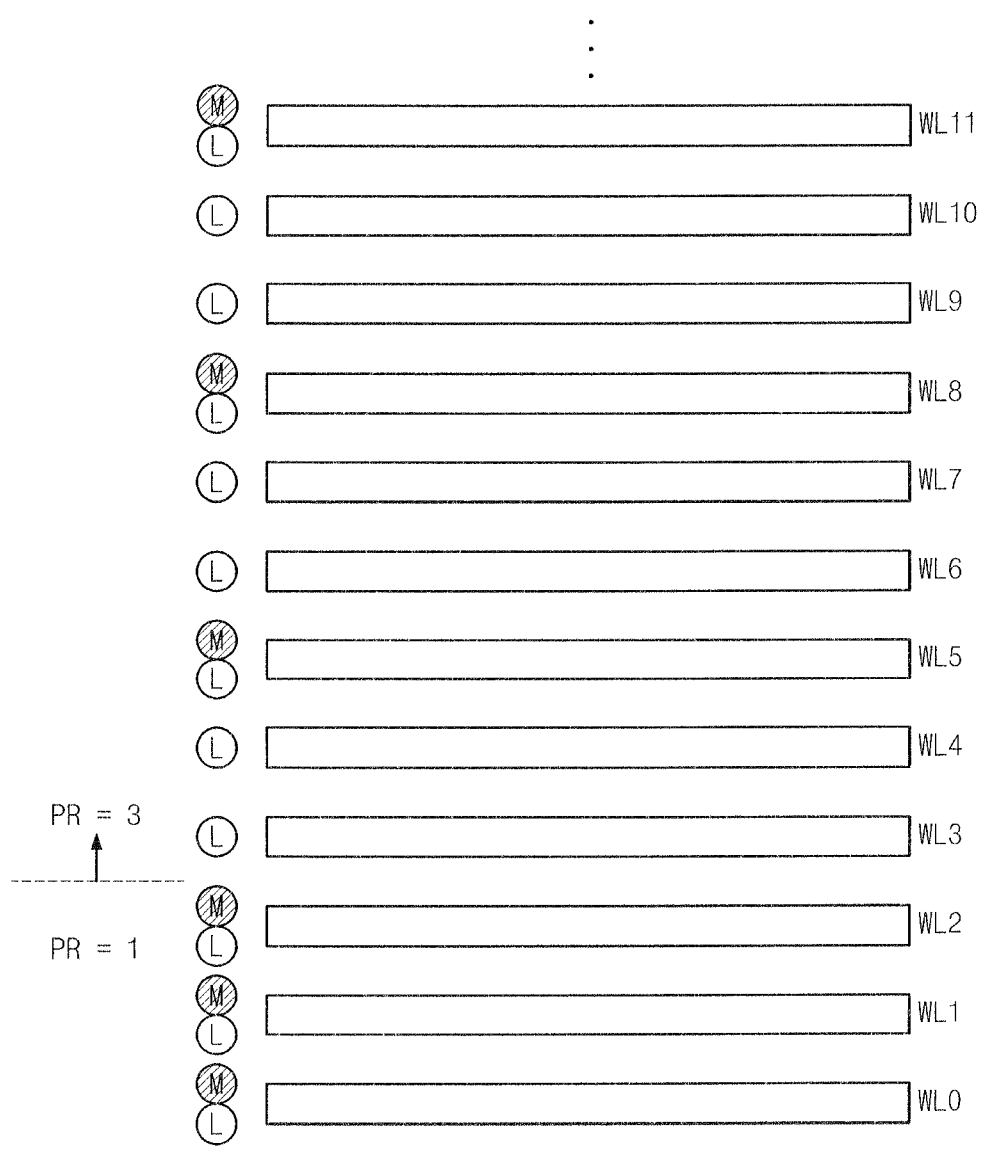
FIG. 4 is a diagram illustrating a variation in program ratios according to an exemplary embodiment of the inventive concept.

FIG. 4 is a diagram illustrating a variation in program ratios according to an exemplary embodiment of the inventive concept. Referring to FIG. 4, LSB and MSB pages may be programmed at memory cells connected to word lines WL0 to WL2. In other words, a program ratio PR of an LSB page to an MSB page may be '1'. Afterwards, a program ratio PR on word lines WL3, WL4, etc. may be changed to '3'. As illustrated in FIG. 4, an LSB page may be programmed at memory cells connected to the word line WL3, an LSB page may be programmed at memory cells connected to the word line WL4, and both LSB and MSB pages may be programmed at memory cells connected to the word line WL5.

The program operation illustrated in FIG. 4 may be exemplary. The inventive concept is not limited thereto. The program ratio PR can be set variously.

Figure 5:
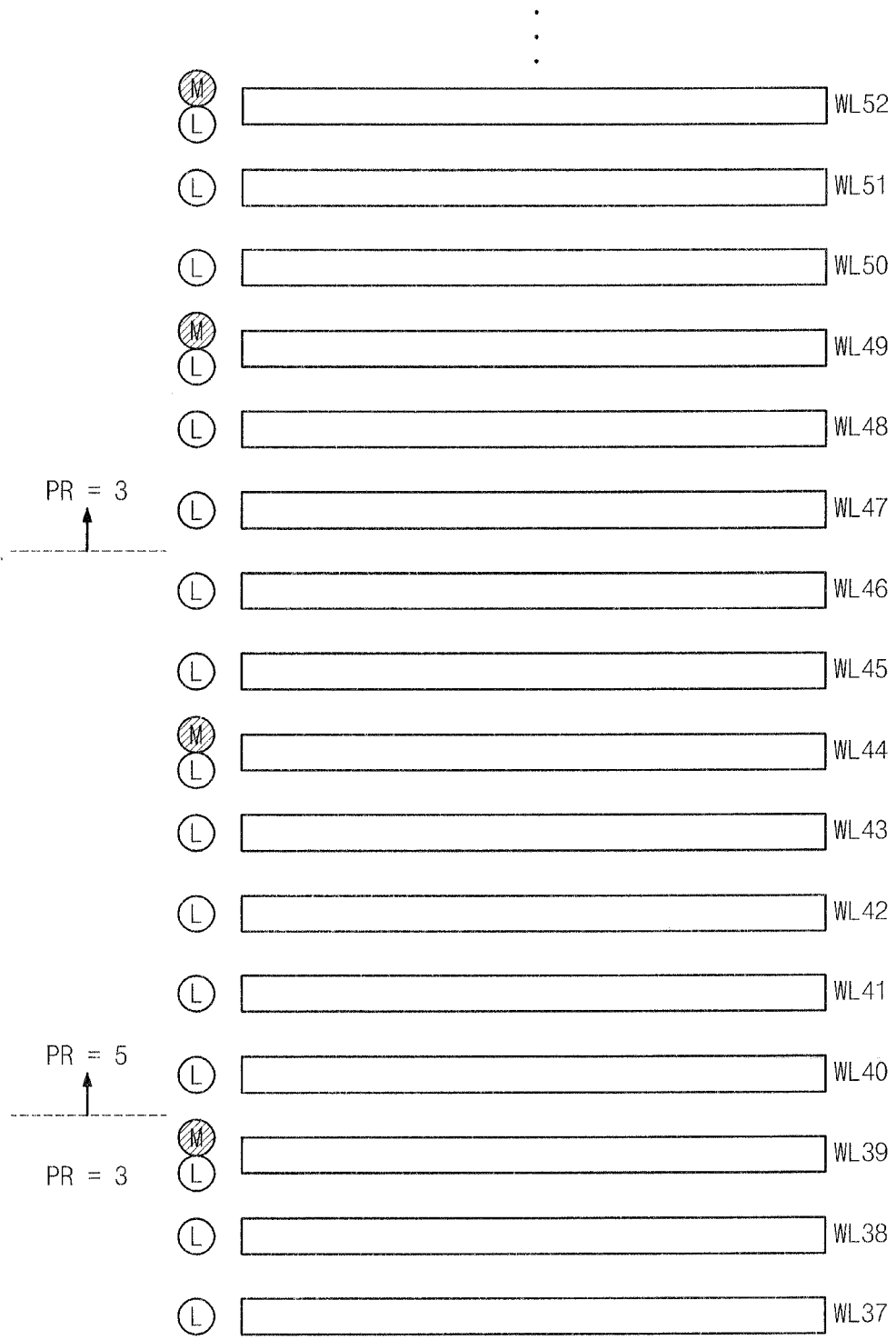
FIG. 5 is a diagram illustrating a variation in program ratios according to an exemplary embodiment of the inventive concept.

FIG. 5 is a diagram illustrating a variation in program ratios according to an exemplary embodiment of the inventive concept. Referring to FIG. 5, a program ratio PR may be changed to '5' from '3' and then to '3' from '5'.

Since the program ratio PR is first set to '3', an LSB page may be programmed at memory cells connected to word lines WL37 and WL38, and both LSB and MSB pages may be programmed at memory cells connected to a word line WL39.

Afterwards, the program ratio PR may be changed to '5'. Thus, an LSB page may be programmed at memory cells connected to each of word lines WL40 to WL43, and both LSB and MSB pages may be programmed at memory cells connected to a word line WL44.

After an LSB page is programmed at memory cells connected to each of word lines WL45 and WL46, the program ratio PR may be changed to '3' from '5'. In this ease, an LSB page may be programmed at memory cells connected to each of word lines WL47 and WL48, and both LSB and MSB pages may be programmed at memory cells connected to a word line WL49. The program ratio PR of 3 may be applied to remaining word lines WL50, WL51, etc.

With the program method according to an exemplary embodiment of the inventive concept, a program ratio PR of LSB page programming to MSB page programming may be changed freely.

The program method described in relation to FIGS. 3 to 5 may be applicable to a 2-bit program operation. However, the inventive concept is not limited thereto. A program method according to an exemplary embodiment of the inventive concept may be applicable to a 3-bit program operation.

Figure 6:
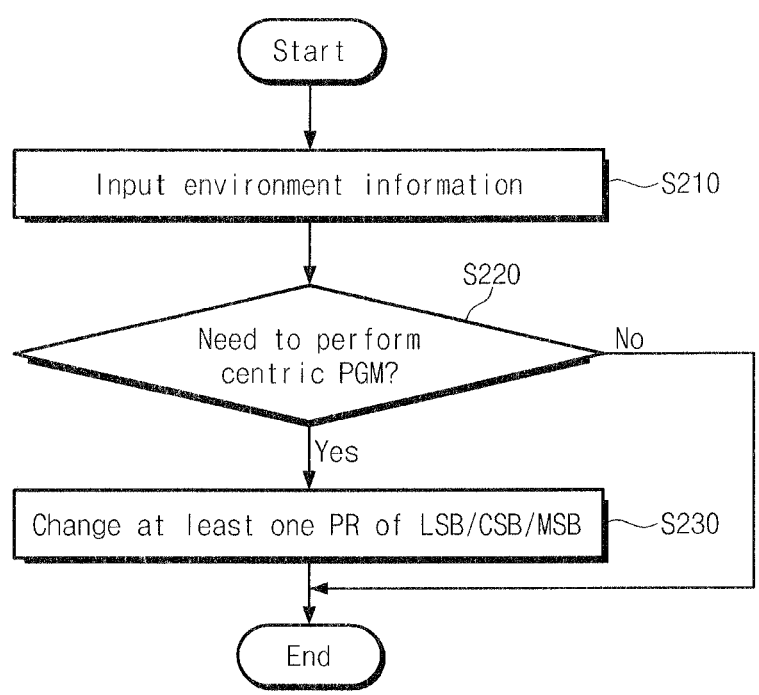
FIG. 6 is a flowchart describing a program method of a memory system according to an exemplary embodiment of the inventive concept.

FIG. 6 is a flowchart describing a program method of a memory system according to an exemplary embodiment of the inventive concept. A program method will be described with reference to FIGS. 1, 2, and 6. The program method illustrated in FIG. 6 may be applied to a 3-bit program operation.

In operation S210, the centric program module 220 of the controller 200 may receive environment information. In operation S220, the centric program module 220 may judge whether a centric program mode is needed, based on the input environment information. If the centric program mode is required, in operation S230, the centric program module 220 may vary/change/adjust/control a program ratio PR of at least one pair of LSB, CSB, and MSB pages to a reference value.

For example, in the centric program mode, a program ratio PR of LSB and CSB pages may be changed, a program ratio PR of CSB and MSB pages may be changed, or a program ratio PR of LSB and MSB pages may be changed.

With the program method according to an exemplary embodiment of the inventive concept, it is possible to change/adjust/control/vary a program ratio PR of at least one pair of LSB, CSB, and MSB pages.

Figure 7:
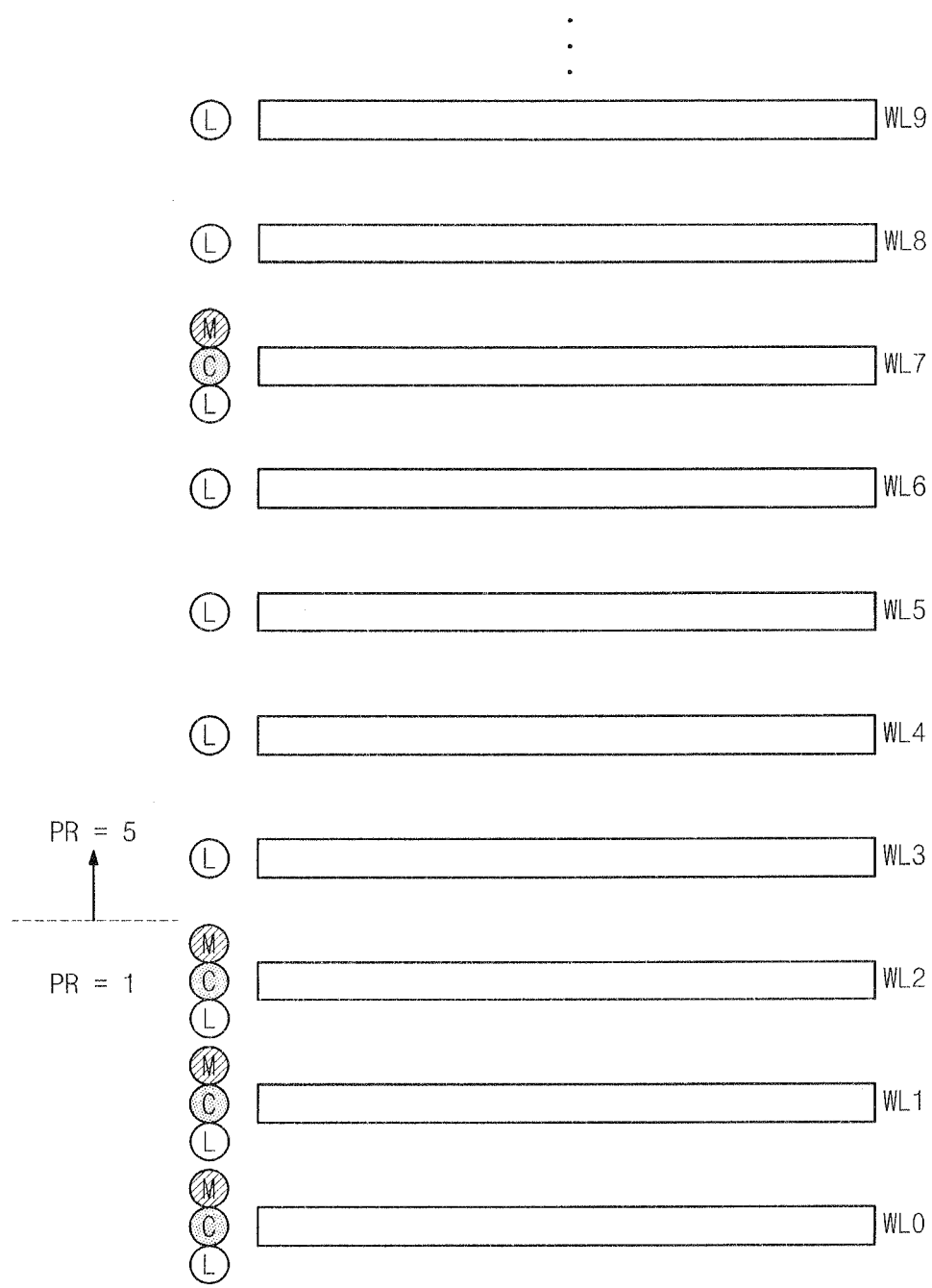
FIG. 7 is a diagram illustrating a variation in program ratios according to an exemplary embodiment of the inventive concept.

FIG. 7 is a diagram illustrating a variation in program ratios according to an exemplary embodiment of the inventive concept. Referring to FIG. 7, LSB, CSB, and MSB pages may be programmed at memory cells connected to each of word lines WL0 to WL2. In other words, a program ratio PR of LSB and MSB pages (or, LSB and CSB pages) may be '1'. A program ratio PR on word lines WL3, WL4, etc. may be set to '5'. As illustrated in FIG. 7, an LSB page may be programmed at memory cells connected to each of word lines WL3 to WL6, and LSB, CSB, and MSB pages may be programmed at memory cells connected to a word line WL7. A program ratio PR on the remaining word lines WL8, WL9, etc. may be set to '3'.

Figure 8:
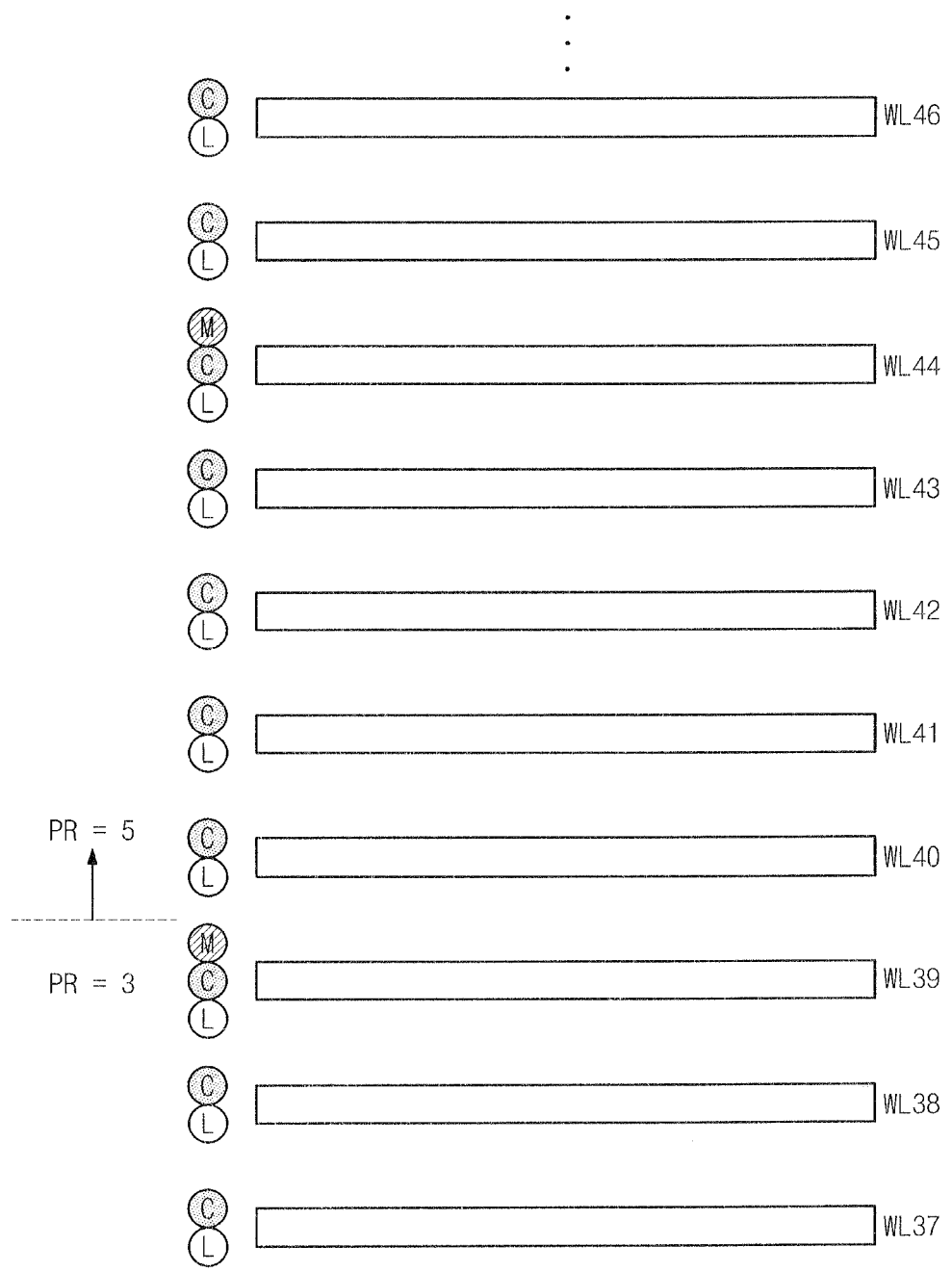
FIG. 8 is a diagram illustrating a variation in program ratios according to an exemplary embodiment of the inventive concept.

FIG. 8 is a diagram illustrating a variation in program ratios according to an exemplary embodiment of the inventive concept. In FIG. 8, there is illustrated the case where a program ratio PR of CSB and MSB pages is changed to '5' from '3'. Since the program ratio PR is '3', LSB and CSB pages may be programmed at memory cells connected to each of word lines WL37 and WL38, and LSB, CSB, and MSB pages may be programmed at memory cells connected to a word line WL39. Afterwards, since the program ratio PR is changed to '5' from '3', LSB and CSB pages may be programmed at memory cells connected to each of word lines WL40 and WL43, and LSB, CSB, and MSB pages may be programmed at memory cells connected to a word line WL44. The program ratio PR on the remaining word lines WL45, WL46, etc. may be kept at '5'.

Environment information according to an exemplary embodiment of the inventive concept can be a command selected by a user. For example, a centric program mode may commence by a user selecting a command directing the device to enter a low-power mode.

Figure 9:
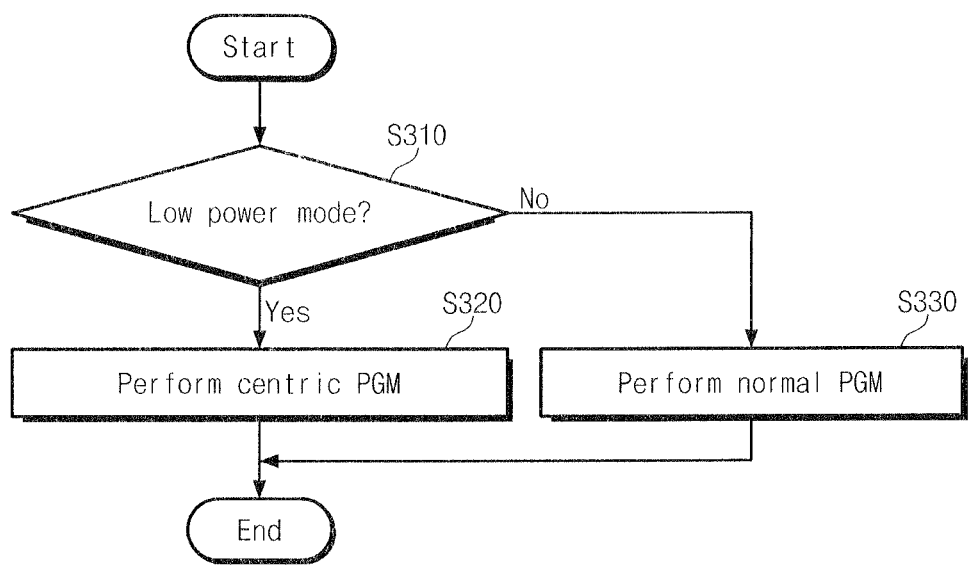
FIG. 9 is a flowchart describing a program method of a memory system according to an exemplary embodiment of the inventive concept.

FIG. 9 is a flowchart describing a program method of a memory system according to an exemplary embodiment of the inventive concept. A program method of the memory system 10 will be described with reference to FIGS. 1 and 9.

In operation S310, the controller 200 may judge whether an operating mode of the memory system 10 is a low-power mode. Herein, the low-power mode may be selected by a user of the memory system 10, or may be invoked by an internal operation of the memory system 10. If the operating mode is judged to be the low-power mode, the method proceeds to operation S320, in which the centric program module 220 controls the nonvolatile memory device 100 to perform its program operations in a centric program mode. Herein, in the centric program mode, programming accompanying less power consumption may be performed more than programming having large power consumption. If the operating mode is judged not to be the low-power mode, the method proceeds to operation S330, in which the nonvolatile memory device 100 performs its program operations in a normal program mode.

With the program method according to an exemplary embodiment of the inventive concept, a centric program mode may be performed in a low-power mode.

The program method according to an exemplary embodiment of the inventive concept may further include judging whether the centric program mode is executable.

Figure 10:
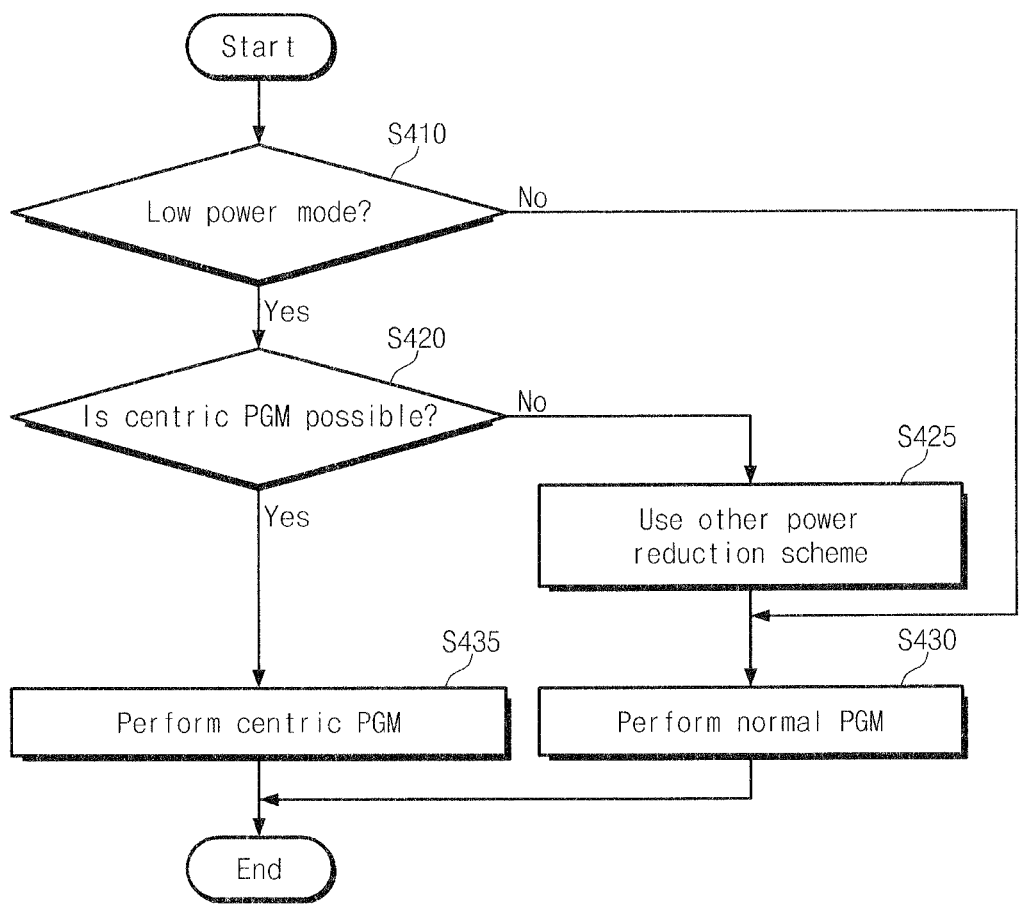
FIG. 10 is a flowchart describing a program method of a memory system according to an exemplary embodiment of the inventive concept.

FIG. 10 is a flowchart describing a program method of a memory system according to an exemplary embodiment of the inventive concept. A program method of the memory system 10 will be described with reference to FIGS. 1 and 10.

In operation S410, the controller 200 may judge whether an operating mode of the memory system 10 is a low-power mode. If the operating mode is judged to be the low-power mode, the method proceeds to operation S420, in which the controller 200 judges whether a centric program mode is executable. In the case that the centric program mode is not executable due to deterioration of the nonvolatile memory device 100, in operation S425, another power saving scheme may be executed. Herein, the power saving scheme, for example, may include setting a way number. A way number may be equal to the number of nonvolatile memory devices connected to one channel. Afterwards, in operation S430, the nonvolatile memory device 100 may perform its program operations in a normal program mode. Operations S425 and S430 may be flipped. If the centric program mode is judged to be executable, in operation S435, program operations in the centric program mode may be performed.

With the program method according to an exemplary embodiment of the inventive concept, if a centric program mode is not executable in a low-power mode, a normal program mode may be performed using another power saving scheme.

Figure 11:
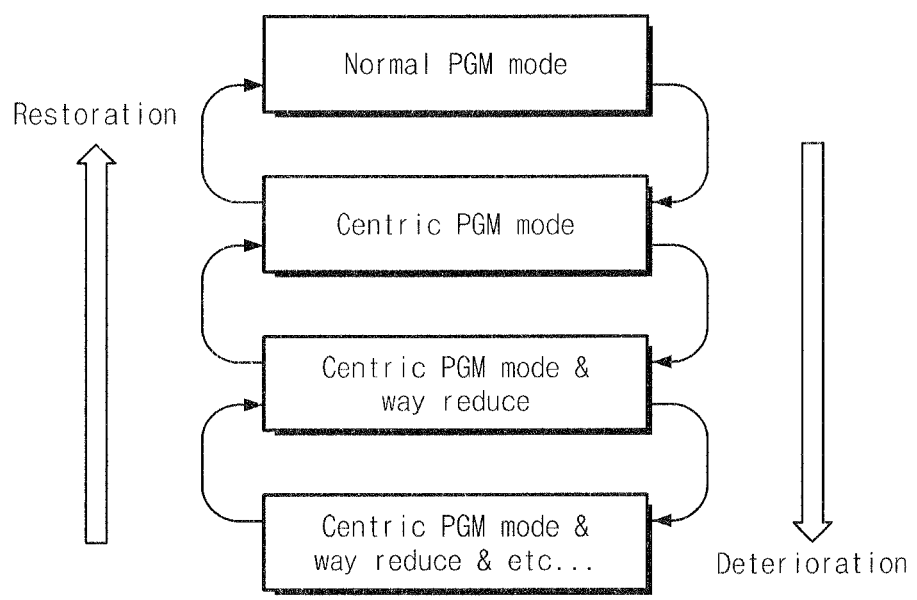
FIG. 11 is a diagram describing a variation in a program mode of operation, according to performance based on power consumption, of a memory system according to an exemplary embodiment of the inventive concept.

FIG. 11 is a diagram describing a variation in a program mode of operation, according to performance based on power consumption, of a memory system according to an exemplary embodiment of the inventive concept. Referring to FIG. 11, in the case that the performance of the memory system 10 is gradually deteriorated, an operating mode may be changed to a centric program mode of operation from a normal program mode of operation, to a centric program mode of operation and way reduction from a centric program mode of operation, and to a centric program mode of operation, way reduction and another power saving/reduction mode of operation from a centric program mode of operation and way reduction. Herein, power consumption of the memory system 10 may be lowered by reducing ways.

A detailed description on reducing power consumption by way reduction is disclosed in U.S. Patent Application Publication No. 2010/0274951, the disclosure of which is incorporated by reference herein in its entirety. In the case that the performance of the memory system 10 is gradually restored, a program mode of operation may be changed in the restoration direction, as shown in FIG. 11.

A mode of operation of the memory system 10 according to an exemplary embodiment of the inventive concept may be dynamically changed to an appropriate program mode of operation according to the performance of the memory system 10 based on power consumption.

Figure 12:
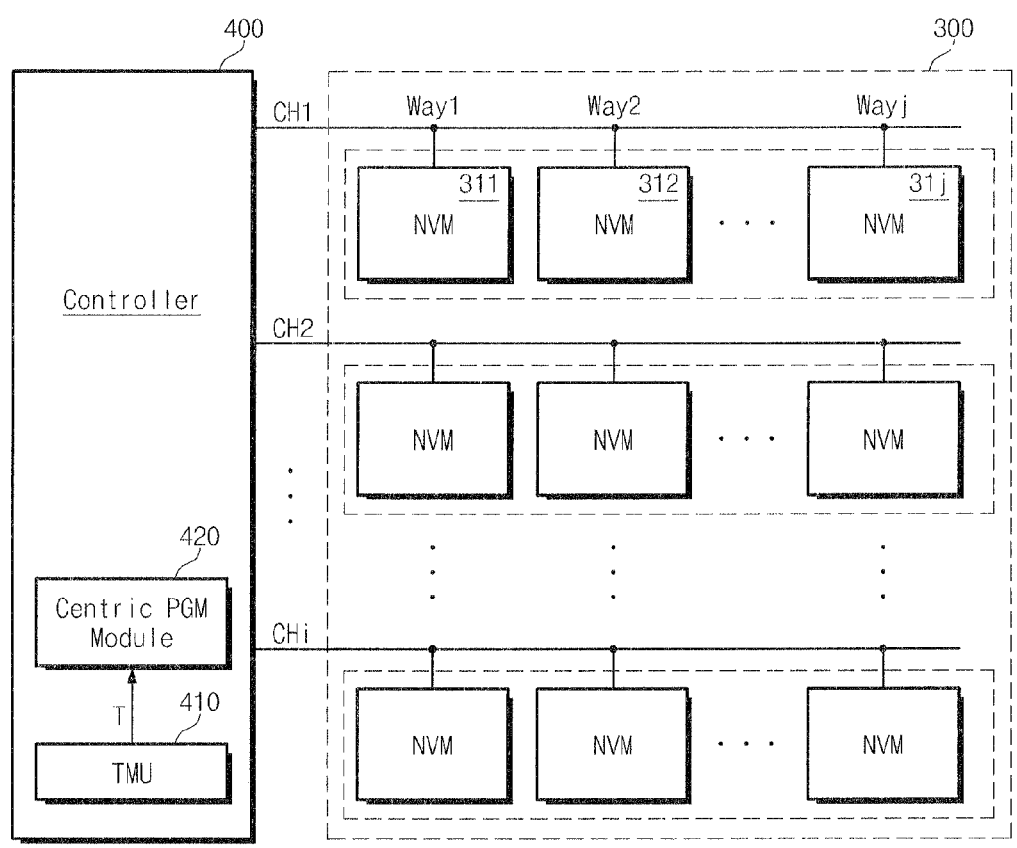
FIG. 12 is a block diagram illustrating a memory system according to an exemplary embodiment of the inventive concept.

FIG. 12 is a block diagram illustrating a memory system according to an exemplary embodiment of the inventive concept. Referring to FIG. 12, a memory system 20 may include NAND flash memory devices 300 and a controller 400.

The NAND flash memory devices 300 may be connected to the controller 400 via a plurality of channels CH1 to CHi (i being an integer of 2 or more). Each channel may be shared by a plurality of NAND flash memory devices. For example, a first channel CH1 may be shared by a plurality of NAND flash memory devices 311 to 31j (j being an integer of 2 or more). Herein, the number of NAND flash memory devices connected to each channel may be the number of ways. A way may be formed of a group of NAND flash memory devices that are capable of being accessed in parallel. As illustrated in FIG. 12, a first way Way1 may be formed of a group of NAND flash memory devices that are closest to the controller 400, and a way Wayj may be formed of a group of NAND flash memory devices that are furthest from the controller 400.

The controller 400 may control the NAND flash memory devices 300 using a multi-channel multi-way scheme. The controller 400 may include a temperature measuring unit 410 and a centric program module 420.

The temperature measuring unit 410 may measure a temperature of the memory system 20.

In an exemplary embodiment of the inventive concept, the temperature measuring unit 410 may measure a temperature of the memory system 20 in real time.

In an exemplary embodiment of the inventive concept, the temperature measuring unit 410 may measure a temperature of the memory system 20 periodically.

In an exemplary embodiment of the inventive concept, the temperature measuring unit 410 may measure a temperature of the memory system 20 as occasion demands (e.g., in response to a temperature measuring command).

The centric program module 420 may receive a temperature T measured by the temperature measuring unit 410 to determine whether to enter a centric program mode. If the centric program mode is determined to be entered, the centric program module 420 may control the NAND flash memory devices 300 such that programming may be executed according to a centric program manner.

The memory system 20 according to an exemplary embodiment of the inventive concept may determine whether to enter a centric program mode of the NAND flash memory devices 300 based on a measured temperature T.

Figure 13:
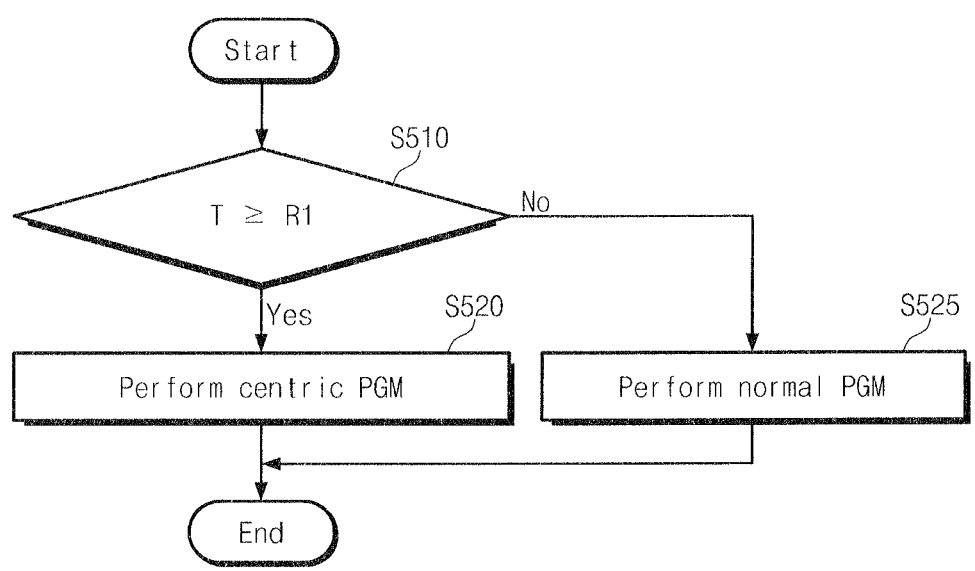
FIG. 13 is a flowchart describing a program method of the memory system in FIG. 12 according to an exemplary embodiment of the inventive concept.

FIG. 13 is a flowchart describing a program method of a memory system in FIG. 12 according to an exemplary embodiment of the inventive concept. A program method of the memory system 20 will be described with reference to FIGS. 12 and 13.

The temperature measuring unit 410 may measure a temperature T of the memory system 20 to output the measured temperature T to the centric program module 420. In operation S510, the centric program module 420 may judge whether the measured temperature T is equal to or larger than a reference value R1. For example, the reference value R1 may be about 30° C.

If the measured temperature T is equal to or larger than the reference value R1, in operation S520, the centric program module 420 may control the NAND flash memory devices 300 such that programming is executed by a centric program mode. If the measured temperature T is smaller than the reference value R1, in operation S525, programming may be executed by a normal program mode.

With the program method of the memory system 20 according to an exemplary embodiment of the inventive concept, a centric program mode may be performed according to a measured temperature T.

FIG. 13 is described using the case that one reference value R1 is used. However, the inventive concept is not limited thereto. For example, a measured temperature can be divided into at least two reference values such that programming is controlled finely.

Figure 14:
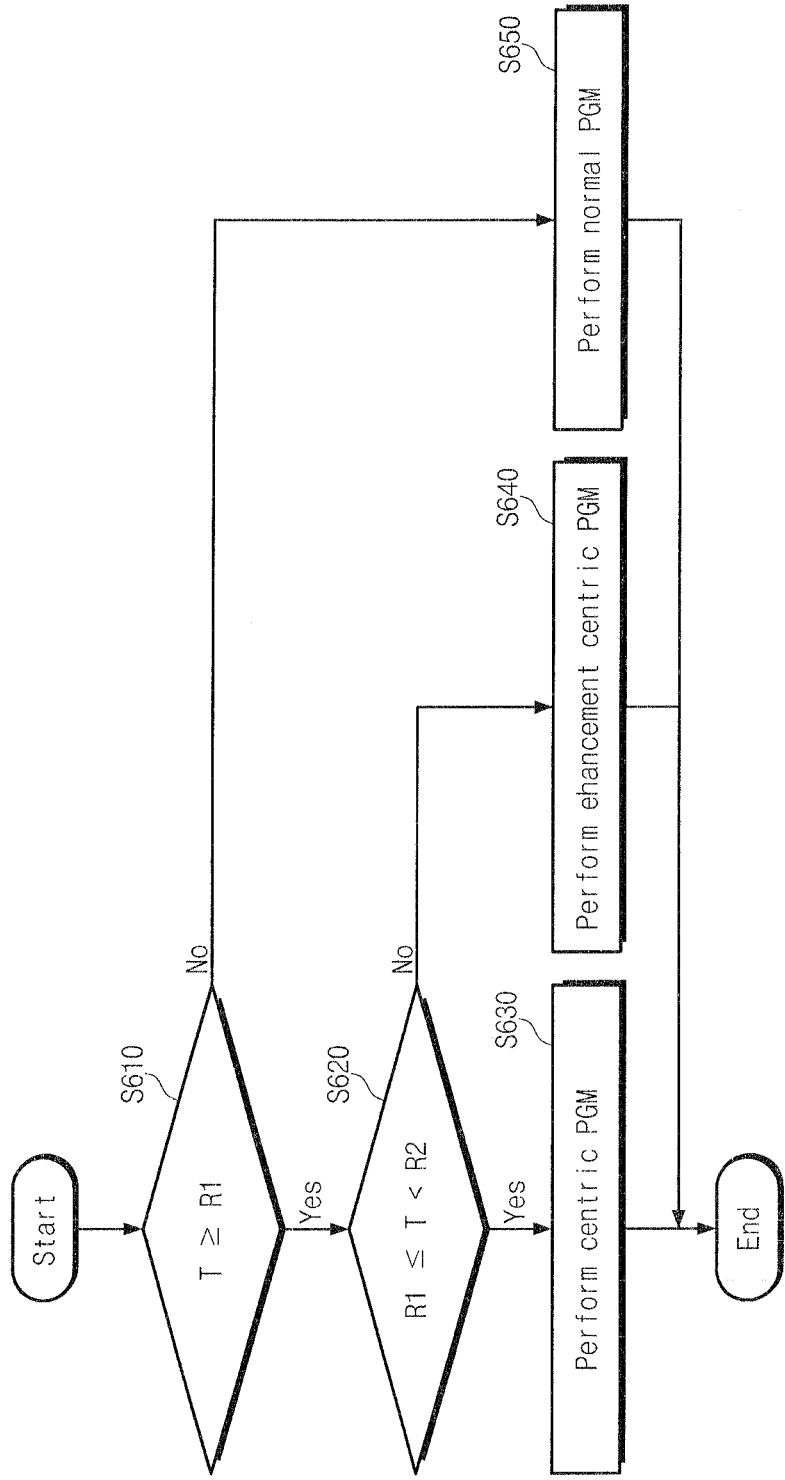
FIG. 14 is a flowchart describing a program method of the memory system in FIG. 12 according to an exemplary embodiment of the inventive concept.

FIG. 14 is a flowchart describing a program method of a memory system in FIG. 12 according to an exemplary embodiment of the inventive concept. A program method of the memory system 20 will be described with reference to FIGS. 12 and 14. Two reference values R1 and R2 are illustrated in FIG. 14.

The temperature measuring unit 410 may measure a temperature T of the memory system 20 to output the measured temperature T to the centric program module 420. In operation S610, the centric program module 420 may judge whether the measured temperature T is equal to or larger than a first reference value R1. For example, the first reference value R1 may be about 30° C.

If the measured temperature T is equal to or larger than the first reference value R1, in operation S620, the centric program module 420 may judge whether the measured temperature T is smaller than a second reference value R2.

If the measured temperature T is equal to or larger than the first reference value R1 and smaller than the second reference value R2, in operation S630, the centric program module 420 may control the NAND flash memory devices 300 such that programming is executed by a centric program mode. For example, the second reference value R2 may be about 45° C.

If the measured temperature T is larger than the second reference value R2, in operation S640, the centric program module 420 may control the NAND flash memory devices 300 such that programming is executed by an enhanced centric program mode. Herein, the enhanced centric program mode may indicate a program operation accompanying less power consumption or heat compared with the centric program mode. For example, a program ratio PR of LSB and MSB pages may be set to '3' for the centric program mode, while a program ratio PR of LSB and MSB pages may be set to '5' for the enhanced centric program mode.

If the measured temperature T is smaller than the first reference value R1, in operation S650, programming may be executed by a normal program mode.

With the program method of the memory system 20 according to an exemplary embodiment of the inventive concept, a centric program mode may be performed with a measured temperature T divided into at least two periods.

In FIGS. 12 to 14, there is described the case that the temperature measuring unit 410 is included within the controller 400. However, the inventive concept is not limited thereto. A temperature measuring unit can be included within a NAND flash memory device.

Figure 15:
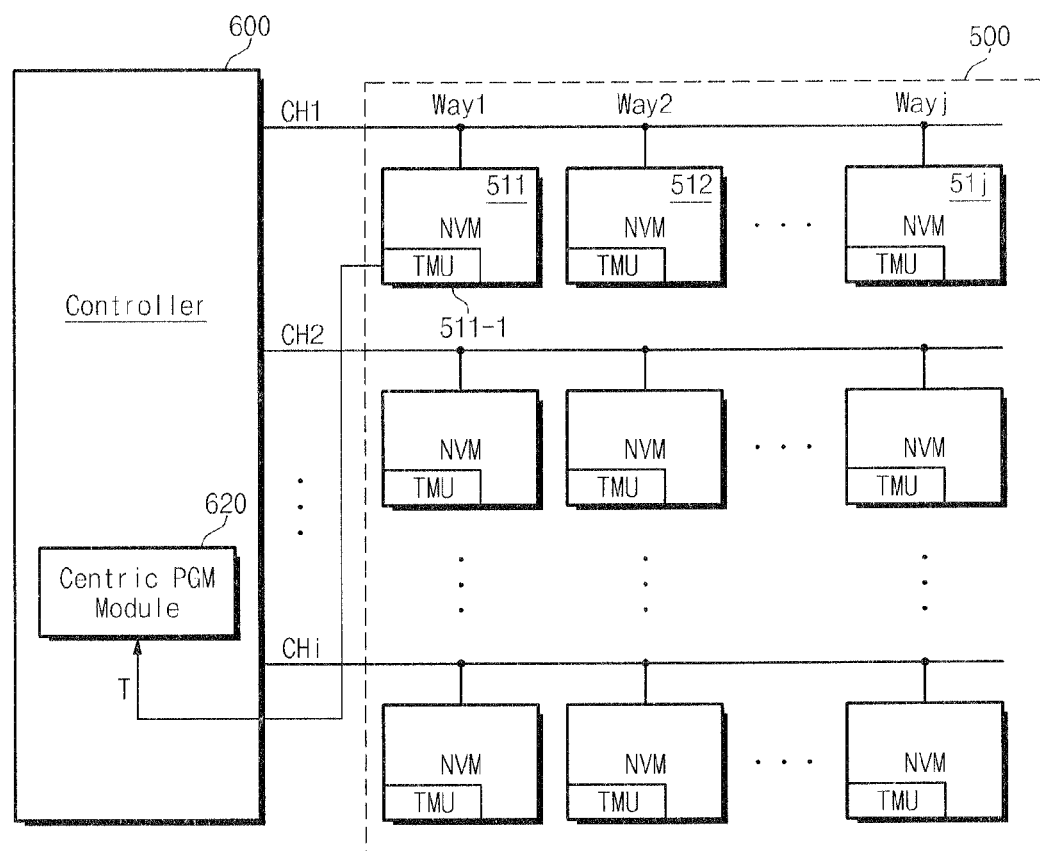
FIG. 15 is a block diagram illustrating a memory system according to an exemplary embodiment of the inventive concept.

FIG. 15 is a block diagram illustrating a memory system according to an exemplary embodiment of the inventive concept. Referring to FIG. 15, a memory system 30 may include NAND flash memory devices 500 and a controller 600.

The NAND flash memory devices 500 may be connected to the controller 600 via a plurality of channels CH1 to CHi (i being an integer of 2 or more). Each of the NAND flash memory devices 500 may include a Temperature Measuring Unit (TMU) 511-1. In exemplary embodiments of the inventive concept, the temperature measuring unit 511-1 may measure a temperature of a NAND flash memory device in real time when it is powered, and may send the measured temperature T to the controller 600. In exemplary embodiments of the inventive concept, the temperature measuring unit 511-1 may measure a temperature of a NAND flash memory device according to a command of the controller 600, and may send the measured temperature T to the controller 600.

The controller 600 may control the NAND flash memory devices 500 using a multi-channel multi-way scheme, and may include a centric program module 620.

The centric program module 620 may receive a measured temperature T from a temperature measuring unit (e.g., 511-1) in at least one of the NAND flash memory devices 500, and may determine whether to enter a centric program mode. If the centric program mode is determined to be entered, the centric program module 620 may control the NAND flash memory devices 500 such that programming is performed by a centric program mode.

The memory system 30 according to an exemplary embodiment of the inventive concept may determine whether to enter a centric program mode of at least one of the NAND flash memory devices 500 based on a temperature T measured within the at least one of the NAND flash memory devices 500.

In FIGS. 1 to 15, there is described the case that a centric program mode of a nonvolatile memory device is performed under the control of a controller. However, the inventive concept is not limited thereto. The inventive concept can be implemented such that a centric program mode is performed within a nonvolatile memory device itself.

Figure 16:
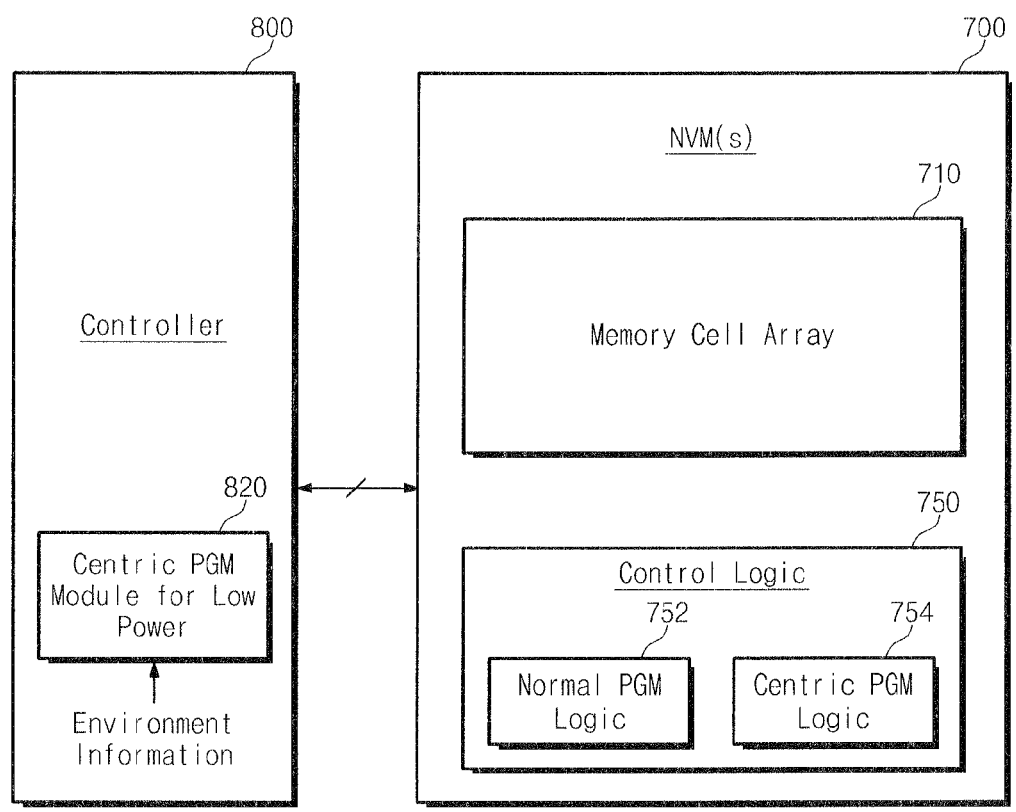
FIG. 16 is a block diagram illustrating a memory system according to an exemplary embodiment of the inventive concept.

FIG. 16 is a block diagram illustrating a memory system according to an exemplary embodiment of the inventive concept. Referring to FIG. 16, a memory system 40 may include at least one nonvolatile memory device 700 and a controller 800.

The nonvolatile memory device 700 may include a memory cell array 710 and control logic 750. The control logic 750 may include normal program logic 752 and centric program logic 754. The control logic 750 may perform a program operation by either one of the normal program logic 752 and the centric program logic 754.

Compared with a program operation executed by the normal program logic 752, a program operation executed by the centric program logic 754 may accompany less power consumption and heat.

The controller 800 may include a centric program module 820. The centric program module 820 may generate a program mode command in response to at least one parameter associated with power, for example, environment information.

With the memory system 40 according to an exemplary embodiment of the inventive concept, the nonvolatile memory device 700 may perform a centric program mode itself according to a program mode command generated according to environment information associated with power.

The inventive concept is applicable to a vertical semiconductor memory device (also, called a three-dimensional (3D) semiconductor memory device or VNAND).

Figure 17:
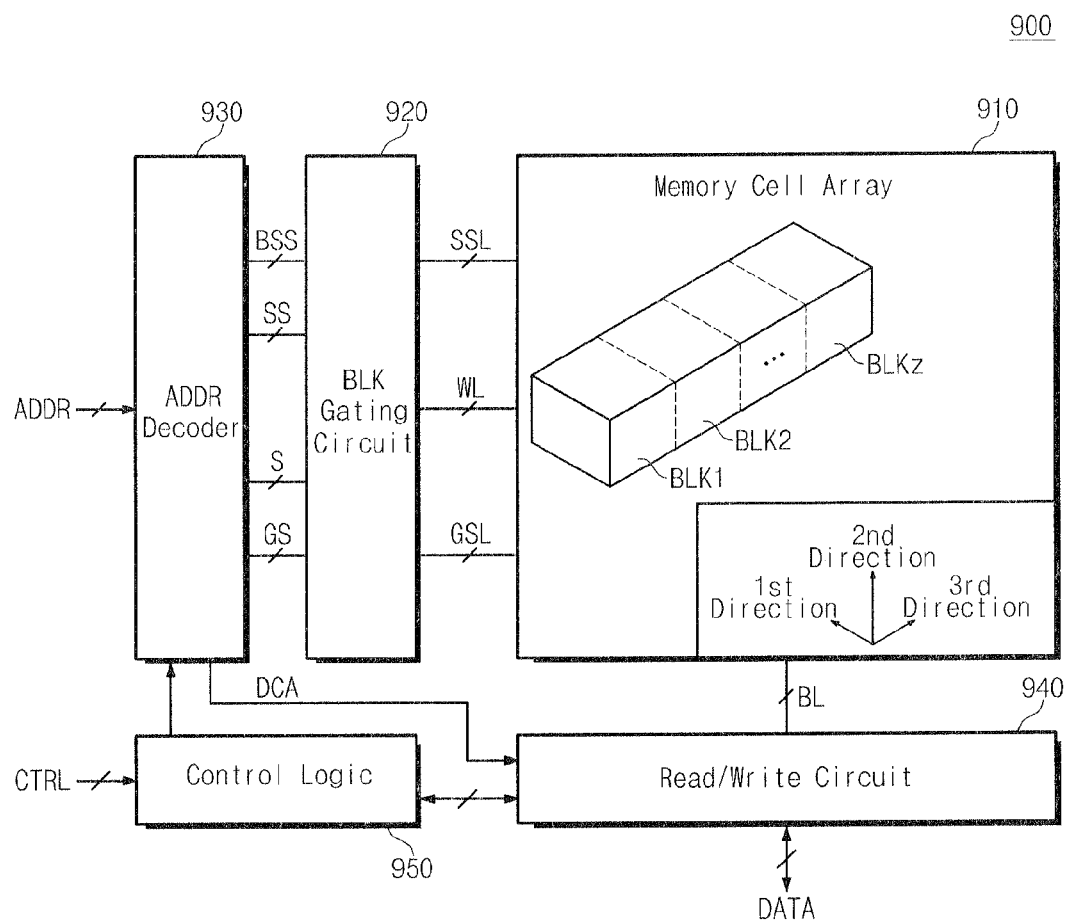
FIG. 17 is a block diagram illustrating a vertical NAND according to an exemplary embodiment of the inventive concept.

FIG. 17 is a block diagram illustrating a vertical NAND according to an exemplary embodiment of the inventive concept. Referring to FIG. 17, a vertical NAND (VNAND) 900 may include a memory cell array 910, a block gating circuit 920, an address decoder 930, a read/write circuit 940, and control logic 950.

The memory cell array 910 may include a plurality of memory blocks BLK1 to BLKz, which form a structure, stacked along a second direction (or, a vertical direction), on a plane extending along first and third directions. Each memory block may include a plurality of vertical strings extending in a direction vertical to a substrate. Each vertical string may include a plurality of memory cells stacked along a direction perpendicular to the substrate. In other words, memory cells may be arranged on the substrate in rows and columns, and may be stacked in a direction perpendicular to the substrate to form a 3D structure. In exemplary embodiments of the inventive concept, the memory cell array 910 may include memory cells each of which stores one or more bits of data.

The block gating circuit 920 may be connected to the memory cell array 910 via string selection lines SSL, word lines WL, and ground selection lines GSL. The block gating circuit 920 may be connected to the address decoder 930 via string lines SS, selection lines S, and ground lines GS. The block gating circuit 920 may receive a block selection signal BSS from the address decoder 930.

The block gating circuit 920 may select a memory block of the memory cell array 910 in response to the block selection signal BSS. The block gating circuit 920 may electrically connect string selection lines SSL, word lines WL, and a ground selection line or ground selection lines GSL of the selected memory block with the string lines SS, the selection lines S, and the ground line or ground lines GS.

The address decoder 930 may be connected to the block gating circuit 920 via the string lines SS, the selection lines S, and the ground line or ground lines GS. The address decoder 930 may be configured to operate responsive to the control of the control logic 950. The address decoder 930 may receive an address ADDR from an external device. The address decoder 930 may be configured to decode a row address of the input address ADDR. The address decoder 930 may output the block selection signal BSS based on a decoded block address of the decoded row address. The address decoder 930 may select a selection line, corresponding to the decoded row address, from among the selection lines S. The address decoder 930 may select a string line, corresponding to the decoded row address, from among the string lines SS and a ground line, corresponding to the decoded row address, from among the ground line or ground lines GS.

The address decoder 930 may decode a column address of the input address ADDR. The address decoder 930 may provide the decoded column address DCA to the read/write circuit 940. In exemplary embodiments of the inventive concept, the address decoder 930 may include a row decoder for decoding a row address, a column decoder for decoding a column address, and an address buffer for storing an input address ADDR.

The read/write circuit 940 may be connected to the memory cell array 910 via bit lines BL. The read/write circuit 940 may be configured to exchange data DATA with an external device. The read/write circuit 940 may operate responsive to the control of the control logic 950. The read/write circuit 940 may receive the decoded column address DCA from the address decoder 930. The read/write circuit 940 may select the bit lines BL in response to the decoded column address DCA.

In exemplary embodiments of the inventive concept, the read/write circuit 940 may receive data DATA from an external device to store it in the memory cell array 910. The read/write circuit 940 may read data from the memory cell array 910 to output it to the external device. The read/write circuit 940 may read data from a first storage region of the memory cell array 910 to store it in a second storage region of the memory cell array 910. In other words, the read/write circuit 940 may perform a copy-back operation.

In exemplary embodiments of the inventive concept, the read/write circuit 940 may include elements such as a page buffer (or, a page register), a column selector circuit, a data buffer, and the like. In exemplary embodiments of the inventive concept, the read/write circuit 940 may include elements such as a sense amplifier, a write driver, a column selector circuit, a data buffer, and the like.

The control logic 950 may be connected to the address decoder 930 and the read/write circuit 940. The control logic 950 may be configured to control an operation of the VNAND 900

Figure 18:
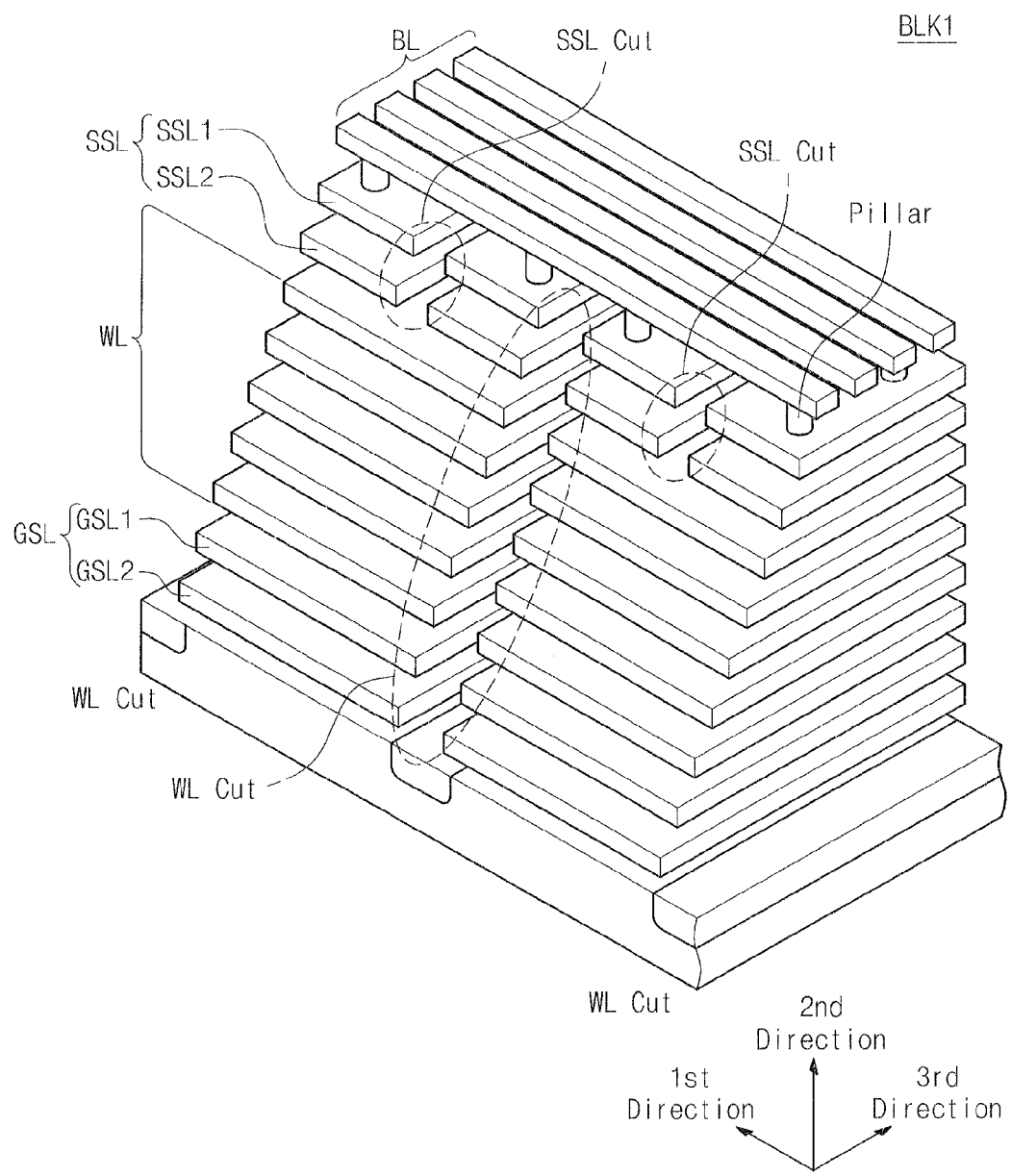
FIG. 18 is a perspective view of a memory block illustrated in FIG. 17, according to an exemplary embodiment of the inventive concept.

FIG. 18 is a perspective view of a memory block illustrated in FIG. 17, according to an exemplary embodiment of the present invention. Referring to FIG. 18, at least one ground selection line GSL, a plurality of word lines WL, and at least one string selection line SSL may be stacked on a substrate between word line cuts WL Cut. Herein, the at least one string selection line SSL may be separated by a string selection line cut SSL Cut. A plurality of pillars may penetrate at least one ground selection line GSL, a plurality of word lines WL, and at least one string selection line SSL. Herein, at least one ground selection line GSL, a plurality of word lines WL, and at least one string selection line SSL may be formed to have a substrate shape. Bit lines BL may be connected to an upper surface of the plurality of pillars.

A memory block in FIG. 18 may have a word line merge structure. However, the inventive concept is not limited thereto. A vertical-type semiconductor memory device (or, VNAND) is disclosed in U.S. Patent Application Publication Nos. 2009/0310415, 2010/0078701, 2010/0117141, 2010/0140685, 2010/0213527, 2010/0224929, 2010/0315875, 2010/0322000, 2011/0013458, and 2011/0018036, the disclosures of which are incorporated by reference herein in their entireties.

Figure 19:
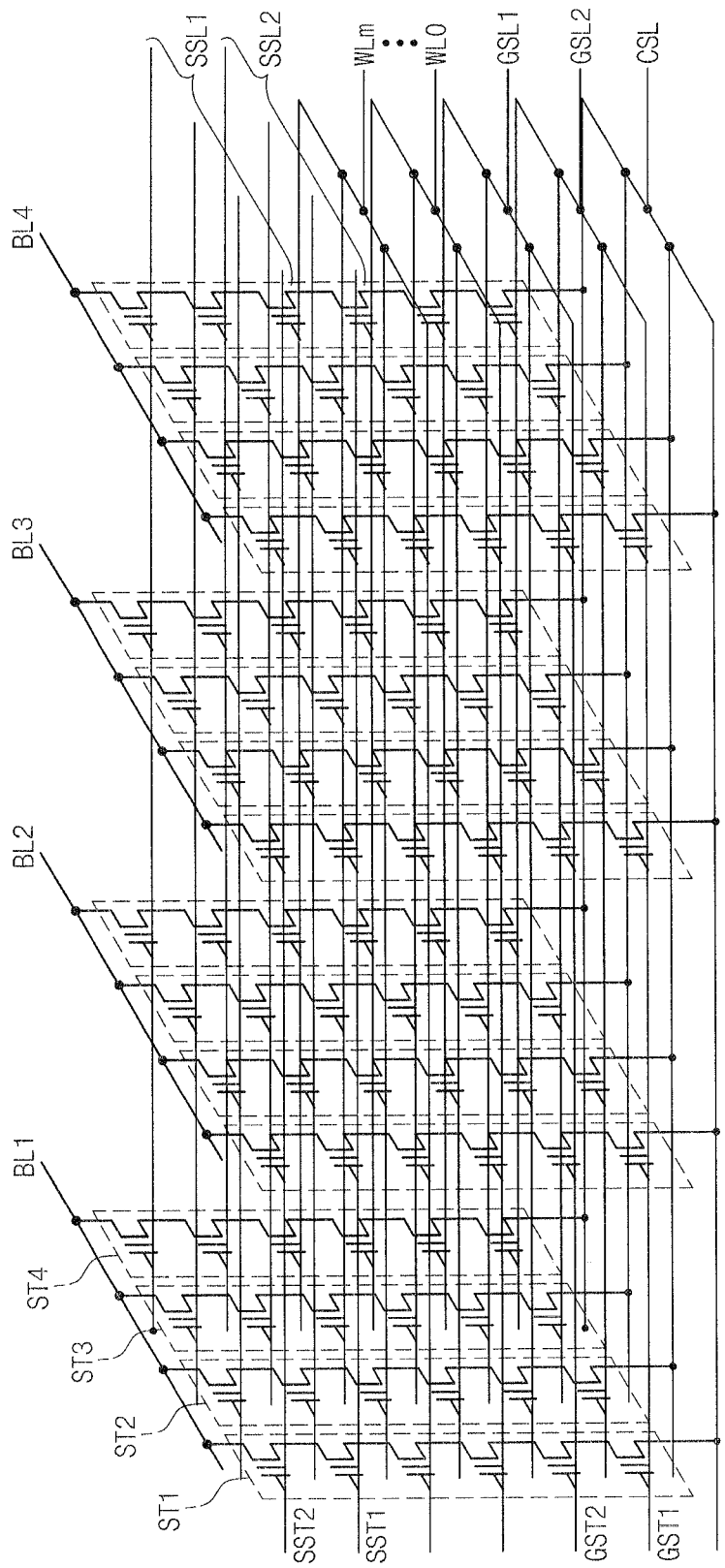
FIG. 19 is a circuit diagram illustrating an equivalent circuit of the memory block illustrated in FIG. 17, according to an exemplary embodiment of the inventive concept.

FIG. 19 is a circuit diagram illustrating an equivalent circuit of a memory block illustrated in FIG. 17, according to an exemplary embodiment of the inventive concept. Referring to FIG. 19, a memory block may have a shared bit line structure. For example, four strings ST1 to ST4 may be provided between a first bit line BL1 and a common source line CSL to be connected to the first bit line BL1. Each of the strings ST1 to ST4 may include two serially-connected string selection transistors SST1 and SST2, which are connected to string selection lines SSL1 and SSL2, respectively. Each of the strings ST1 to ST4 may include two serially-connected ground selection transistors GST1 and GST2, which are connected to ground selection lines GSL1 and GSL2, respectively. Each of the strings ST1 to ST4 includes transistors connected to word lines WL0 to WLm. Duplicates of the four strings ST1 to ST4 may be provided between bit lines BL2, BL3 and BL4 and the common source line CSL.

The inventive concept is applicable to various devices.

Figure 20:
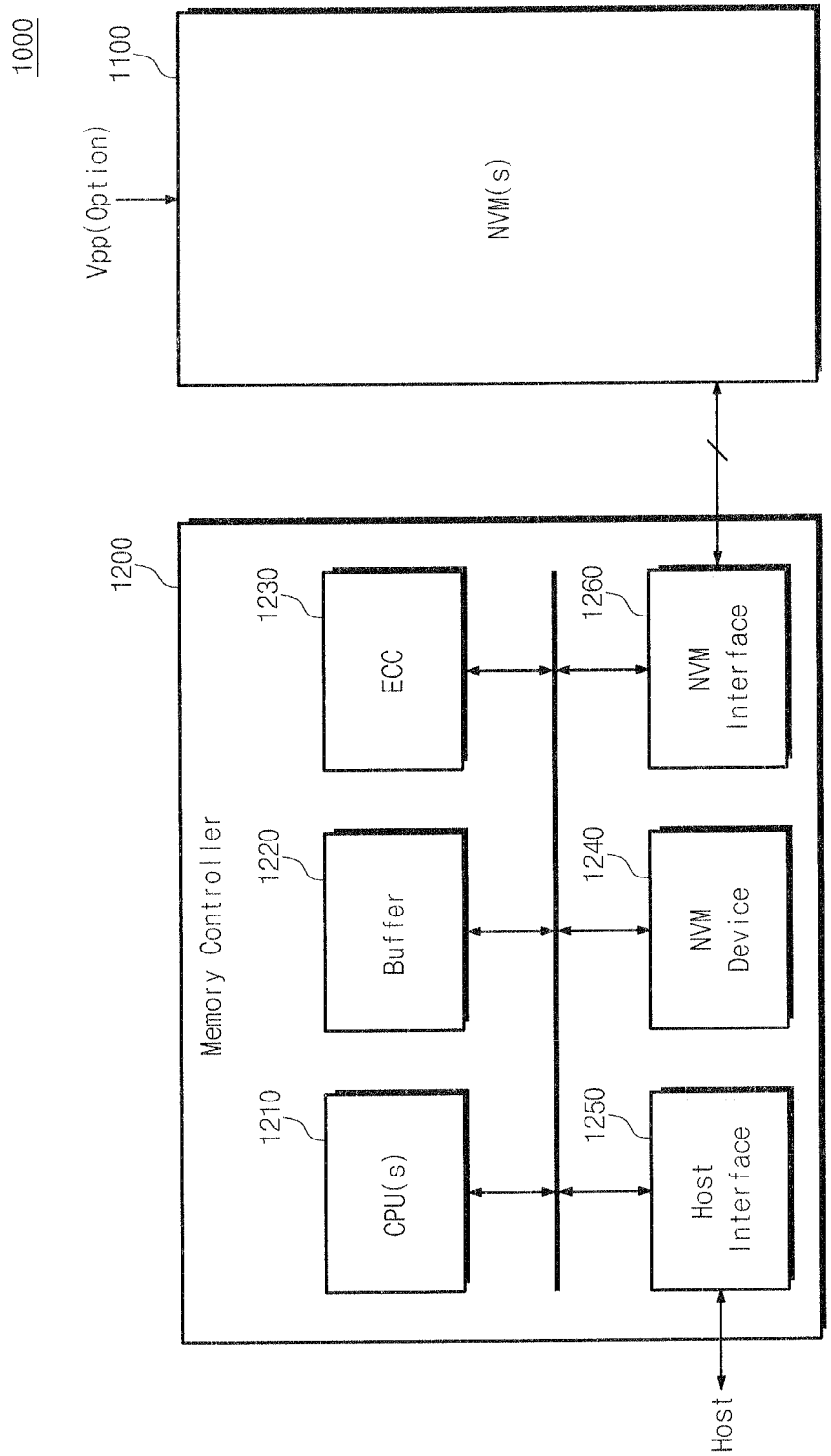
FIG. 20 is a block diagram illustrating a memory system according to an exemplary embodiment of the inventive concept.

FIG. 20 is a block diagram illustrating a memory system according to an exemplary embodiment of the inventive concept. Referring to FIG. 20, a memory system 1000 may include at least one nonvolatile memory device 1100 and a memory controller 1200. The memory system 1000 may be substantially similar to one of the memory systems 10, 20, 30, and 40 illustrated in FIGS. 1, 12, 15, and 16.

The memory controller 1200 may be connected with the nonvolatile memory device 1100 via a plurality of channels. The memory controller 1200 may include at least one Central Processing Unit (CPU) 1210, a buffer memory 1220, an error correcting code (ECC) circuit 1230, a nonvolatile memory device 1240, a host interface 1250, and a memory interface 1260. The nonvolatile memory device 1240 may store the centric program module 220 in FIG. 1 through programming. Although not shown in FIG. 20, the memory controller 1200 may further comprise a randomization circuit that randomizes and de-randomizes data. The memory system 1000 according to an exemplary embodiment of the inventive concept is applicable to a perfect page new (PPN) memory.

The nonvolatile memory device 1100 may be optionally supplied with a high voltage Vpp from the outside.

A detailed description of the memory system 1000 (other than the program method according to the exemplary embodiments of the inventive concept and the core components effectuating the program method) is disclosed in U.S. Pat. No. 8,027,194 and U.S. Patent Application Publication No. 2010/0082890, the disclosures of which are incorporated by reference herein in their entireties.

Figure 21:
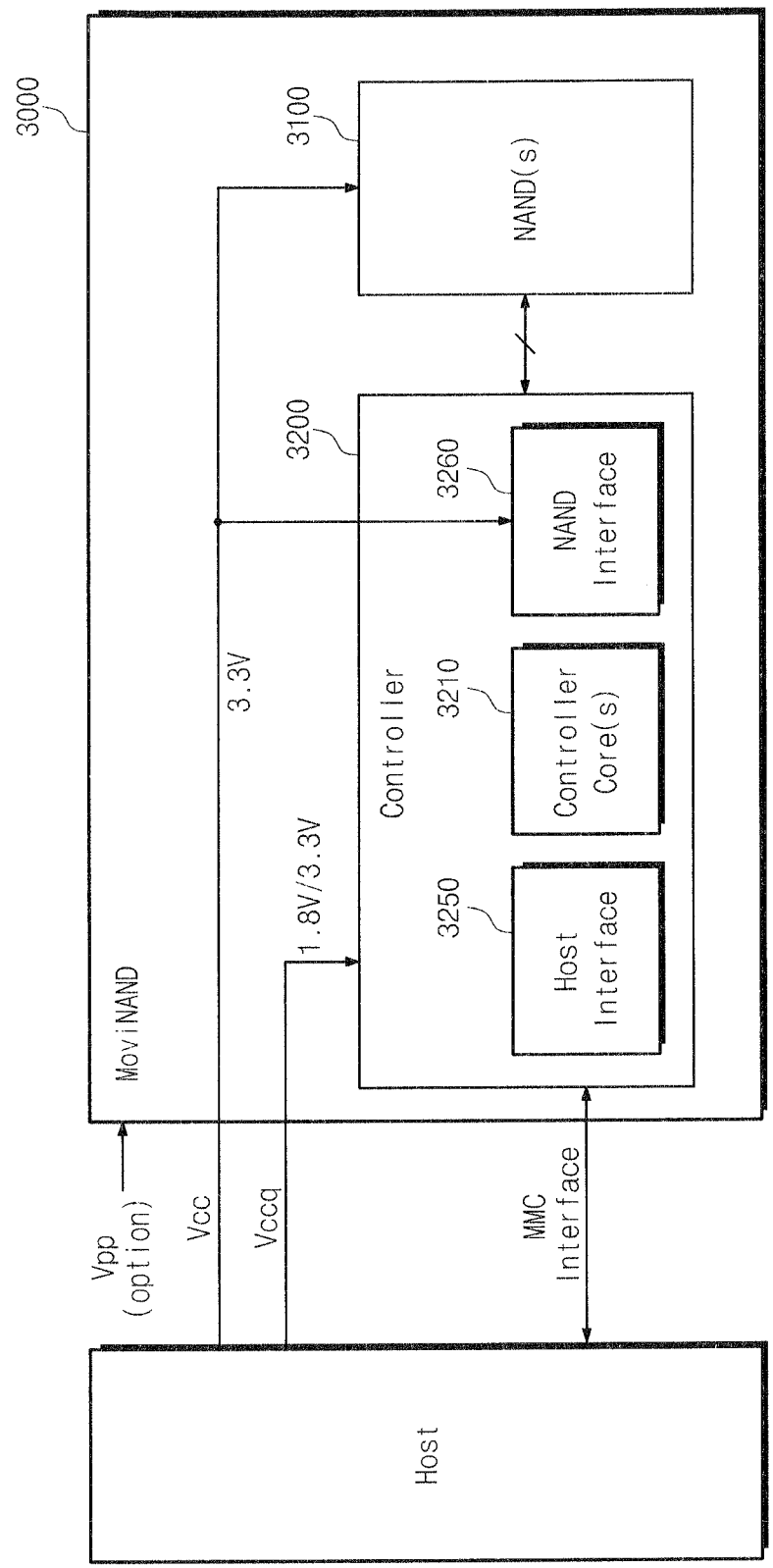
FIG. 21 is a block diagram illustrating a moviNAND according to an exemplary embodiment of the inventive concept.

FIG. 21 is a block diagram illustrating a moviNAND according to an exemplary embodiment of the inventive concept. Referring to FIG. 21, a moviNAND device 3000 may include at least one NAND flash memory device 3100 and a controller 3200. The moviNAND device 3000 may support the MMC 4.4 (called eMMC) standard, with MMC referring to multi-media card. The moviNAND device 3000 may be implemented to have the same or similar configuration and operation as one of the memory systems 10, 20, 30, and 40 illustrated in FIGS. 1, 12, 15, and 16.

The NAND flash memory device 3100 may be a Single Data Rate (SDR) or Double Data Rate (DDR) NAND flash memory device. In exemplary embodiments of the inventive concept, the NAND flash memory device 3100 may include unitary NAND flash memory devices. Herein, unitary NAND flash memory devices may be stacked within a package (e.g., a Fine-pitch Ball Grid Array (FBGA)).

The controller 3200 may be connected to the flash memory device 3100 via a plurality of channels. The controller 3200 may include at least one controller core 3210, a host interface 3250, and a NAND interface 3260. The controller core 3210 may control an operation of the moviNAND device 3000. The host interface 3250 may provide an interface between the controller 3200 and a host. The NAND interface 3260 may be configured to provide an interface between the NAND flash memory device 3100 and the controller 3200. In exemplary embodiments of the inventive concept, the host interface 3250 may be a parallel interface (e.g., an MMC interface). In exemplary embodiments of the inventive concept, the host interface 3250 of the moviNAND device 3000 may be a serial interface (e.g., ultra high speed (UHS)-II or universal flash storage (UFS) interface).

The moviNAND device 3000 may receive power supply voltages Vcc and Vccq from the host. Herein, the power supply voltage Vcc (about 3.3V) may be supplied to the NAND flash memory device 3100 and the NAND interface 3260, while the power supply voltage Vccq (about 1.8V/3.3V) may be supplied to the controller 3200. In exemplary embodiments of the inventive concept, the moviNAND device 3000 may be optionally supplied with a high voltage Vpp from the outside. The high voltage Vpp may be provided to the NAND flash memory device 3100.

The moviNAND device 3000 according to an exemplary embodiment of the inventive concept may store massive data and may have an improved read characteristic. The moviNAND device 3000 according to an exemplary embodiment of the inventive concept is applicable to small and low-power mobile products (e.g., a Galaxy S, iPhone, etc.).

The moviNAND device 3000 in FIG. 21 may be provided with a plurality of power supply voltages Vcc and Vccq. However, the inventive concept is not limited thereto. The moviNAND device 3000 according to an exemplary embodiment of the inventive concept can be implemented to generate a power supply voltage (e.g., 3.3V) suitable for a NAND interface and a NAND flash memory by internally boosting or regulating an input power supply voltage Vcc. This technique is disclosed in U.S. Pat. No. 7,092,308, the disclosure of which is incorporated by reference herein in its entirety.

Figure 22:
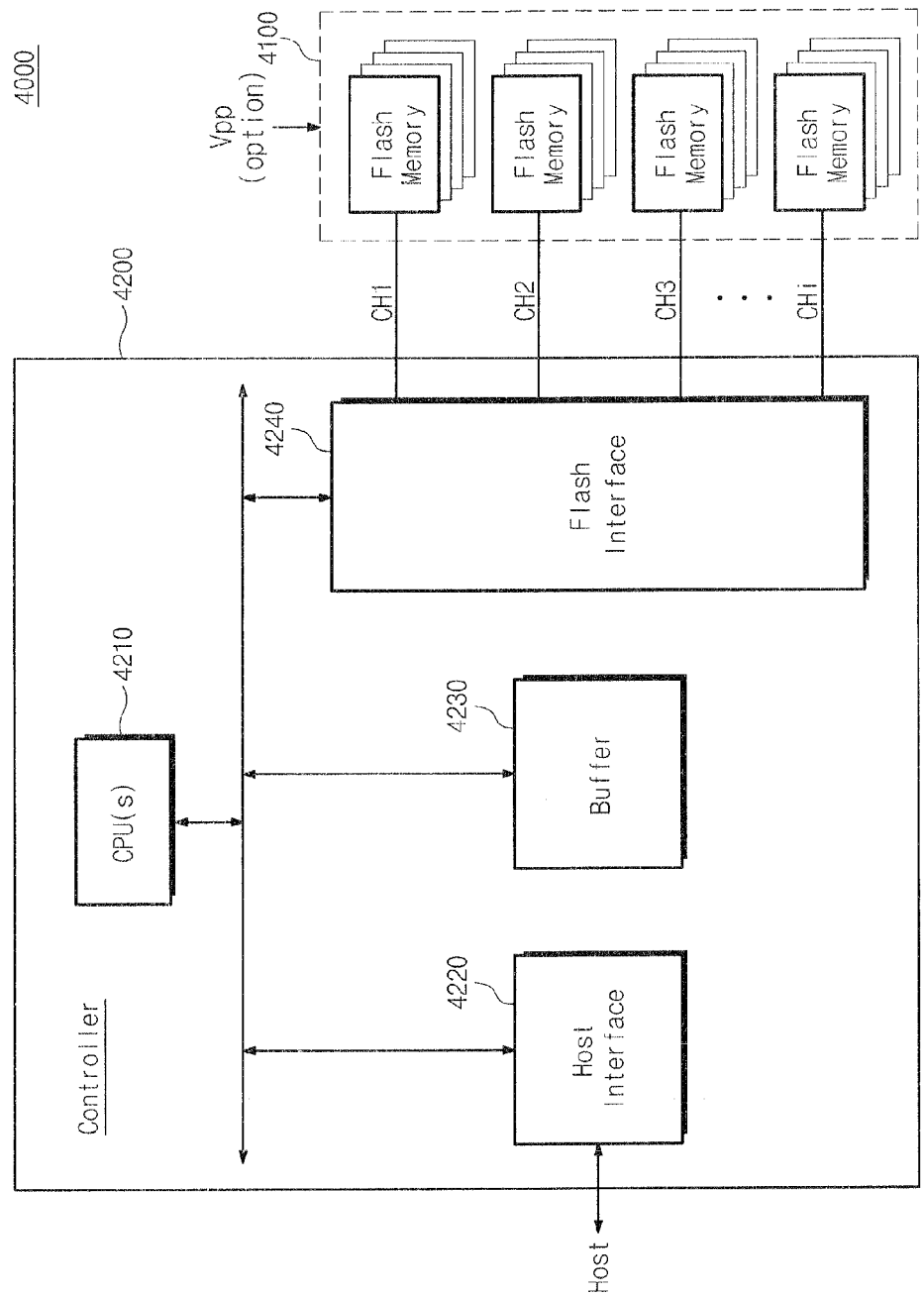
FIG. 22 is a block diagram of a solid state drive (SSD) according to an exemplary embodiment of the inventive concept.

FIG. 22 is a block diagram of a solid state drive (SSD) according to an exemplary embodiment of the inventive concept. Referring to FIG. 22, an SSD 4000 may include a plurality of flash memory devices 4100 and an SSD controller 4200. The SSD 4000 may be implemented to have the same or similar configuration and operation as one of the memory systems 10, 20, 30, and 40 illustrated in FIGS. 1, 12, 15, and 16.

The flash memory devices 4100 may be optionally supplied with a high voltage Vpp from the outside.

The SSD controller 4200 may be connected to the flash memory devices 4100 via a plurality of channels CH1 to CHi. The SSD controller 4200 may include at least one CPU 4210, a host interface 4220, a buffer memory 4230, and a flash interface 4240.

The buffer memory 4230 may be used to temporarily store data transferred between an external device and the flash memory devices 4100. The buffer memory 4230 can be used to store programs to be executed by the CPU 4210. The buffer memory 4230 may be implemented using a static random access memory (SRAM) or a dynamic random access memory (DRAM). The buffer memory 4230 in FIG. 22 may be included within the SSD controller 4200. However, the inventive concept is not limited thereto. The buffer memory 4230 according to an exemplary embodiment of the inventive concept can be provided at the outside of the SSD controller 4200.

Under the control of the CPU 4210, the host interface 4220 may exchange data with a host through a communication protocol. In exemplary embodiments of the inventive concept, the communication protocol may include the Advanced. Technology Attachment (ATA) protocol. The ATA protocol may work with a Serial Advanced Technology Attachment (BATA) interface, a Parallel Advanced Technology Attachment (PATA) interface, an External SATA (ESATA) interface, and the like. In exemplary embodiments of the inventive concept, the communication protocol may include the Universal Serial Bus (UBS) protocol. Data to be received from or transmitted to the host through the host interface 4220 may be delivered through the buffer memory 4230 without passing through a CPU bus, under the control of the CPU 4210.

The flash interface 4240 may be configured to interface between the SSD controller 4200 and the flash memory devices 4100 that are used as storage devices. The flash interface 4240 may be configured to support NAND flash memories, One-NAND flash memories, multi-level flash memories, or single-level flash memories.

The SSD 4000 according to an exemplary embodiment of the inventive concept may perform a centric program mode capable of reducing power consumption and heat. Thus, the SSD 4000 may improve the integrity of data. A more detailed description of the SSD 4000 (other than the program method according to the exemplary embodiments of the inventive concept and the core components effectuating the program method) is disclosed in U.S. Pat. No. 8,027,194 and U.S. Patent Application Publication No. 2010/0082890, the disclosures of which are incorporated by reference herein in their entireties.

Figure 23:
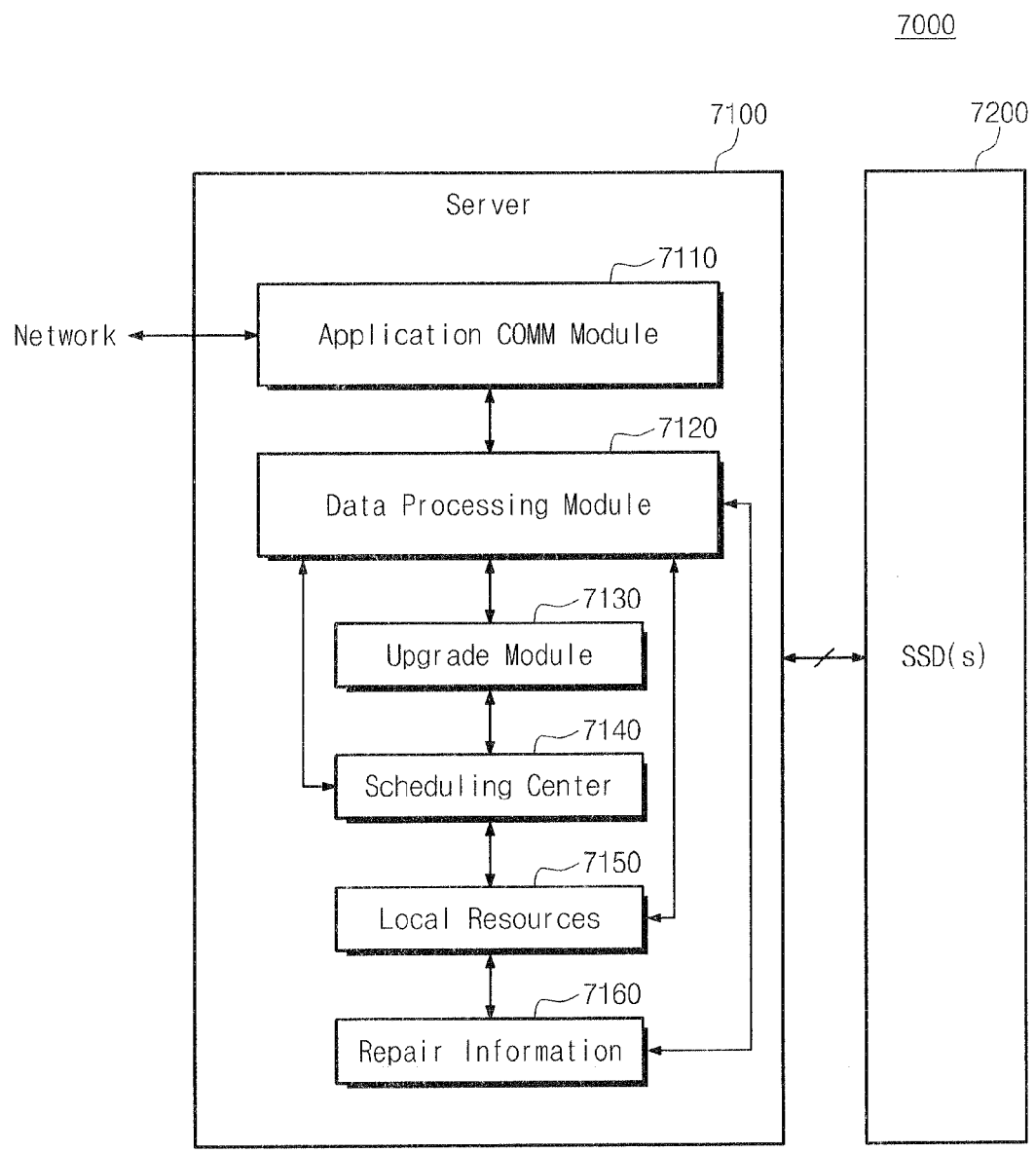
FIG. 23 is a block diagram illustrating a server system according to an exemplary embodiment of the inventive concept.

FIG. 23 is a block diagram illustrating a server system according to an exemplary embodiment of the inventive concept. Referring to FIG. 23, a server system 7000 may include a server 7100 and at least one SSD 7200 that stores data used to drive the server 7100. The SSD 7200 may be configured the same or similar as the SSD 4000 of FIG. 22.

The server 7100 may include an application communication module 7110, a data processing module 7120, an upgrade module 7130, a scheduling center 7140, a local resource module 7150, and a repair information module 7160. The application communication module 7110 may be configured to communicate with a computing system connected to a network and the server 7100 or to allow the server 7100 to communicate with the SSD 7200. The application communication module 7110 may transmit data or information, provided through a user interface, to the data processing module 7120. The data processing module 7120 may be linked to the local resource module 7150. Here, the local resource module 7150 may provide a list of repair shops/dealers/technical information to a user on the basis of information or data inputted to the server 7100. The upgrade module 7130 may interface with the data processing module 7120. Based on information or data received from the SSD 7200, the upgrade module 7130 may perform upgrades of firmware, a reset code, a diagnosis system, or other information on electronic appliances.

The scheduling center 7140 may provide real-time options to the user based on the information or data inputted to the server 7100. The scheduling center 7140 may interface with the data processing module 7120. The repair information module 7160 may interface with the data processing module 7120. The repair information module 7160 may be used to provide repair-related information (e.g., audio, video or document files) to the user. The data processing module 7120 may package information related to the information received from the SSD 7200. The packaged information may be transmitted to the SSD 7200 or may be displayed to the user.

The server system 7000 according to an exemplary embodiment of the inventive concept may perform a centric program mode executed in a low-power mode (or, in a heat preventing mode), thus providing improved performance in consideration of power consumption.

The server system 7000 according to an exemplary embodiment of the inventive concept is applicable to mobile products (e.g., Galaxy S, iPhone, etc.).

Figure 24:
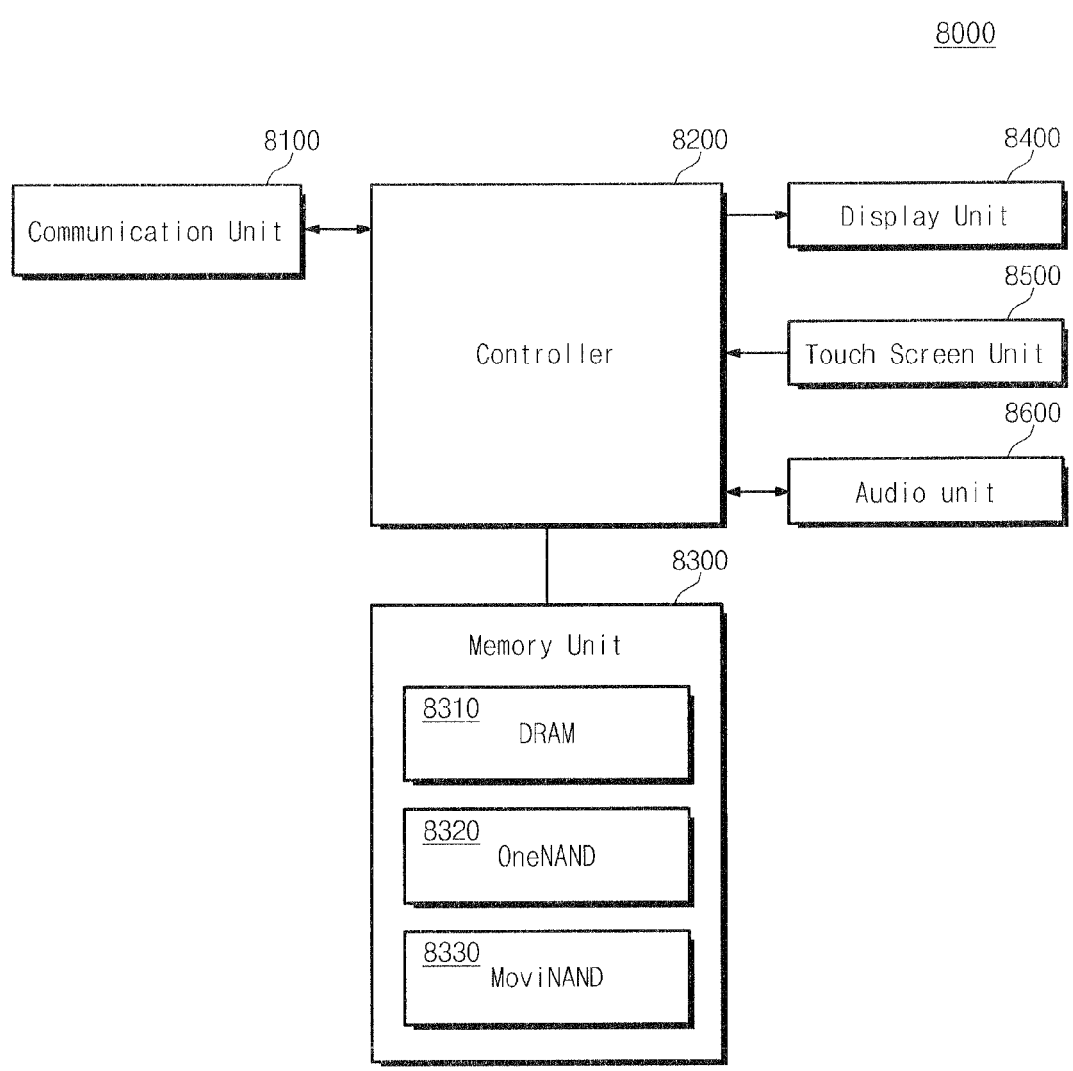
FIG. 24 is a block diagram illustrating a mobile device according to an exemplary embodiment of the inventive concept.

FIG. 24 is a block diagram illustrating a mobile device according to an exemplary embodiment of the inventive concept. Referring to FIG. 24, a mobile device 8000 may include a communication unit 8100, a controller 8200, a memory unit 8300, a display unit 8400, a touch screen unit 8500, and an audio unit 8600.

The memory unit 8300 may include at least one DRAM 8310, at least one OneNAND 8320, and at least one moviNAND 8330. At least one of the OneNAND 8320 and the moviNAND 8330 may be implemented to have the same or similar configuration and operation as one of the memory systems 10, 20, 30, and 40 illustrated in FIGS. 1, 12, 15, and 16.

A detailed description of the mobile device 8000 (other than the program method according to the exemplary embodiments of the inventive concept and the core components effectuating the program method) is disclosed in U.S. Patent Application Publication Nos. 2010/0062715, 2010/0309237, and 2010/0315325, the disclosures of which are incorporated by reference herein in their entireties.

The mobile device 8000 according to an exemplary embodiment of the inventive concept may perform a centric program mode suppressing heat.

The mobile device 8000 according to an exemplary embodiment of inventive concept is applicable to tablet products (e.g., Galaxy Tab, iPad, etc.).

Figure 25:
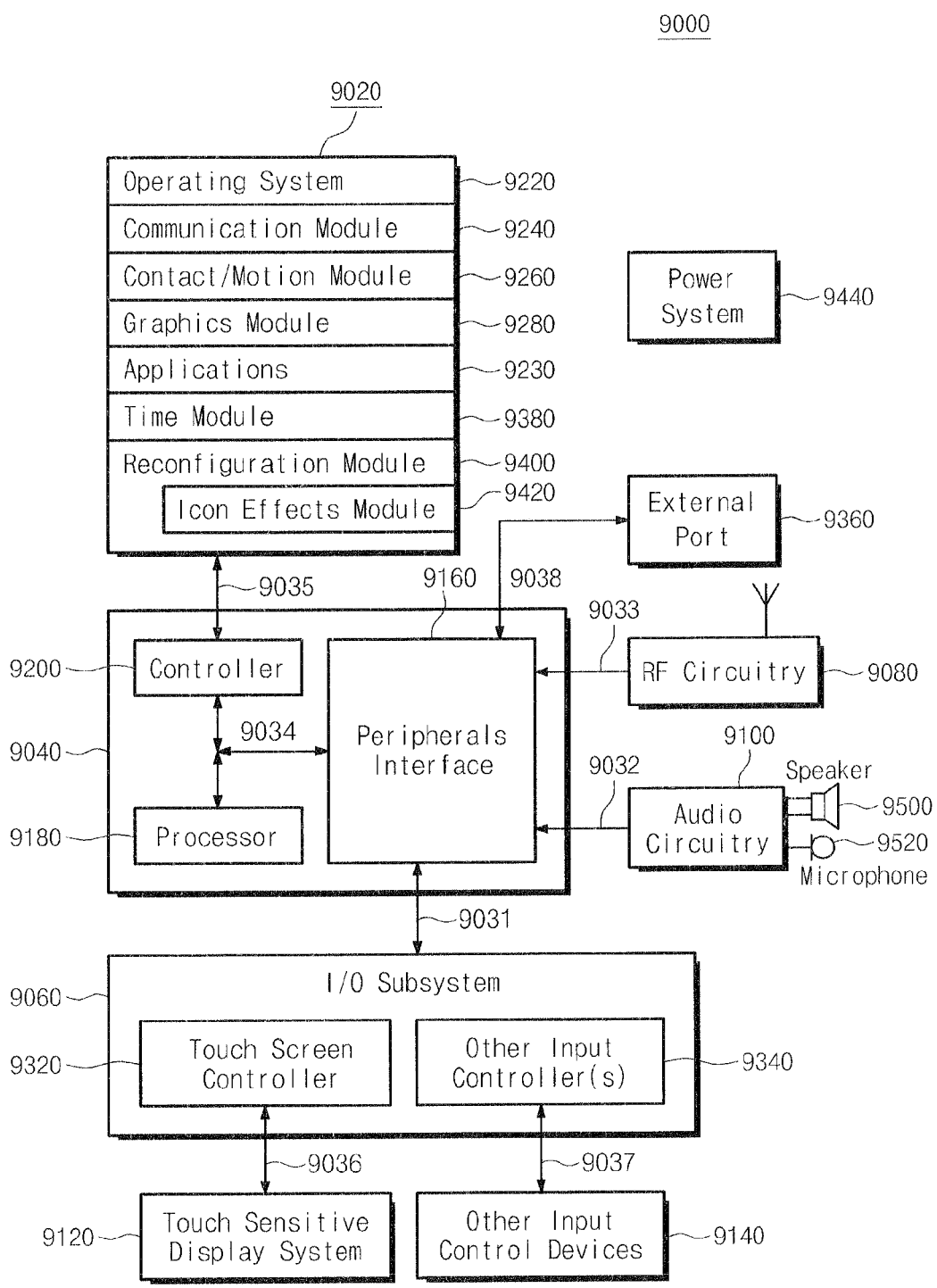
FIG. 25 is a block diagram illustrating a handheld electronic device according to an exemplary embodiment of the inventive concept.

FIG. 25 is a block diagram illustrating a handheld electronic device according to an exemplary embodiment of the inventive concept. Referring to FIG. 25, a handheld electronic device 9000 may include at least one computer-readable media 9020, a processing system 9040, an input/output subsystem 9060, a radio frequency circuit 9080, an audio circuit 9100, an external port 9360, a power system 9440, a touch sensitive display system 9120 and other input control devices 9140. Respective constituent elements of the handheld electronic device 9000 can be interconnected by at least one communication bus or a signal line 9031-9038.

The at least one computer-readable media 9020 may include an operating system 9220, a communication module 9240, a contact/motion module 9260, a graphics module 9280, applications 9230, a time module 9380 and a reconfiguration module 9400 including an icon effects module 9420. The processing system 9040 may include a controller 9200, a processor 9180 and a peripherals interface 9160. The input/output subsystem 9060 may include a touch screen controller 9320 and another input controller or controllers 9340. The audio circuitry 9100 may include a speaker 9500 and a microphone 9520.

The handheld electronic device 9000 may be a portable electronic device including a handheld computer, a tablet computer, a cellular phone, a media player, a personal digital assistant (PDA), or a combination of two or more thereof. Herein, the at least one computer-readable media 9020 may be implemented to have the same or similar configuration and operation as one of the memory systems 10, 20, 30, and 40 illustrated in FIGS. 1, 12, 15, and 16. A detailed description of the handheld electronic device 9000 (other than the program method according to the exemplary embodiments of the inventive concept and the core components effectuating the program method) is disclosed in U.S. Pat. No. 7,509,588, the disclosure of which is incorporated by reference herein in its entirety.

A memory system or a storage device according to an exemplary embodiment of the inventive concept may be mounted in various types of packages. Examples of the packages of the memory system or the storage device according to an exemplary embodiment of the inventive concept may include Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System in Package (SIP), Multi Chip Package (MCP), Wafer-level Fabricated Package (WFP), and Wafer-level Processed Stack Package (WSP).

In accordance with the exemplary embodiments of the inventive concept described above, it is possible to reduce power consumption or to suppress heat of a memory device by performing programming operations in a centric program mode based on information associated with power consumption.

While the inventive concept has been particularly shown and described with reference to exemplary embodiments thereof, it will be understood by those of ordinary skill in the art that various changes in form and detail may be made therein without departing from the spirit and scope of the inventive concept as defined by the following claims.

What is claimed is:

1. A method of programming a storage device including at least one nonvolatile memory device and a controller configured to control the at least one nonvolatile memory device, comprising:
   determining, at the controller, that a first program mode of a plurality of program modes is to be entered in response to first information, wherein the first information includes a parameter associated with temperature, power consumption or input/output workload; and
   changing, using the controller, a program ratio of a first programming and a second programming of the at least one nonvolatile memory device in the first program mode,
   wherein the at least one nonvolatile memory device includes multi-bit cells,
   wherein the first programming is a least significant bit (LSB) program operation on the at least one nonvolatile memory device and the second programming is a most significant bit (MSB) program operation on the at least one nonvolatile memory device,
   wherein the program ratio is changed so that the LSB program operation is performed more times than the MSB program operation,
   wherein the LSB program operation consumes less power or generates less heat than the MSB program operation.

2. The method of claim 1, wherein the program ratio of the first and second programmings is non-uniform in the first mode.

3. The method of claim 2, wherein the program ratio of the first and second programmings is uniform in a second mode of the plurality of program modes.

4. A method of programming a storage device including at least one nonvolatile memory device and a controller configured to control the at least one nonvolatile memory device, comprising:
   determining, at the controller, that a first program mode of a plurality of program modes is to be entered in response to first information, wherein the first information includes a parameter associated with temperature, power consumption or input/output workload; and
   changing, using the controller, a program ratio of a first programming, a second programming and a third programming of the at least one nonvolatile memory device in the first program mode,
   wherein the at least one nonvolatile memory device includes multi-bit cells,
   wherein the first programming is a least significant bit (LSB) program operation on the at least one nonvolatile memory device, the second programming is a center significant bit (CSB) program operation on the at least one nonvolatile memory device and the third programming is a most significant bit (MSB) program operation on the at least one nonvolatile memory device,
   wherein the program ratio is changed so that the LSB program operation is performed more times than the MSB program operation,
   wherein the LSB program operation consumes less power or generates less heat than the MSB program operation.

5. The method of claim 4, wherein the program ratio is changed such that the LSB program operation is performed more times than each of the CSB and MSB program operations, and wherein the CSB and MSB program operations are performed the same number of times.

6. The method of claim 4, wherein the program ratio is changed such that the LSB and CSB program operations are each performed more times than the MSB program operation, and wherein the LSB and CSB program operations are performed the same number of times.

7. The method of claim 4, wherein the program ratio is changed such that the LSB, CSB and MSB program operations are performed a different number of times from each other.

8. A memory system, comprising:
   a plurality of nonvolatile memory devices, wherein each of the nonvolatile memory devices is configured to operate in a first program mode and a second program mode; and
   a controller connected to the nonvolatile memory devices via a plurality of channels, wherein the controller is configured to measure a temperature of the memory system and determine, in response to the measured temperature, whether to operate the nonvolatile memory devices in the first program mode or the second program mode,
   wherein at least one of the nonvolatile memory devices includes multi-level cells,
   wherein the first programming is a least significant bit (LSB) program operation on the at least one of the nonvolatile memory devices and the second programming is a most significant bit (MSB) program operation on the at least one of the nonvolatile memory devices, wherein the program ratio is changed so that the LSB program operation is performed more times than the MSB program operation, wherein the LSB program operation consumes less power or less heat than the MSB program operation.

9. The memory system of claim 8, wherein in the first program mode a program ratio of the LSB and MSB program operations is greater than 1:1 and in the second program mode a program ratio of the LSB and MSB program operations is 1:1.

10. The memory system of claim 8, wherein each channel includes a plurality of ways, each way including one of the nonvolatile memory devices connected to the channel.

11. The memory system of claim 8, wherein the memory system is included in a solid state drive.

* * * * *